(12) United States Patent
Miyachi et al.

(10) Patent No.: US 12,494,416 B2
(45) Date of Patent: Dec. 9, 2025

(54) SEMICONDUCTOR MODULE WITH NON-COMMON WIRING ELECTRODE AND COMMON WIRING REGION

(71) Applicant: DENSO CORPORATION, Kariya (JP)

(72) Inventors: Syuhei Miyachi, Kariya (JP); Toshihiro Fujita, Kariya (JP); Atsushi Saitou, Kariya (JP); Noboru Nagase, Kariya (JP)

(73) Assignee: DENSO CORPORATION, Kariya (JP)

( * ) Notice: Subject to any disclaimer, the term of this patent is extended or adjusted under 35 U.S.C. 154(b) by 798 days.

(21) Appl. No.: 17/657,064

(22) Filed: Mar. 29, 2022

(65) Prior Publication Data

US 2022/0223501 A1 Jul. 14, 2022

Related U.S. Application Data

(63) Continuation of application No. PCT/JP2020/037024, filed on Sep. 29, 2020.

(30) Foreign Application Priority Data

Oct. 1, 2019 (JP) .................................. 2019-181704
Sep. 25, 2020 (JP) .................................. 2020-160930

(51) Int. Cl.
*H01L 23/495* (2006.01)
*B62D 5/04* (2006.01)
*H01L 23/31* (2006.01)

(52) U.S. Cl.
CPC .......... *H01L 23/49524* (2013.01); *B62D 5/04* (2013.01); *H01L 23/3107* (2013.01);
(Continued)

(58) Field of Classification Search
CPC .......... H01L 23/49524; H01L 23/3107; H01L 23/49513; H01L 23/49562;
(Continued)

(56) References Cited

U.S. PATENT DOCUMENTS 5,657,284 A * 8/1997 Beffa .................... G11C 29/50
365/201
7,208,818 B2 * 4/2007 Luo ........................ H01L 24/49
257/676

(Continued)

FOREIGN PATENT DOCUMENTS

JP 2003-046053 A 2/2003
JP 2004-335493 A 11/2004

*Primary Examiner* — Duy T Nguyen
*Assistant Examiner* — Pratiksha Jayant Lohakare
(74) *Attorney, Agent, or Firm* — Maschoff Brennan

(57) ABSTRACT

A semiconductor module includes: semiconductor elements having a gate electrode, a first electrode and a second electrode; a resin mold; and conductive members connected to at least one of the semiconductor elements and having a common wiring electrode exposed from the resin mold and connected to the first electrode or the second electrode and a non-common wiring electrode exposed from the resin mold and connected to an electrode of the semiconductor element different from the common wiring electrode. A width of a common wiring connected to the common wiring electrode is wider than the non-common wiring electrode. The common wiring is arranged from one side to an opposite side on a surface of the resin mold, on which the common wiring electrode is exposed, without being electrically connected to the non-common wiring electrode.

12 Claims, 31 Drawing Sheets

(52) U.S. Cl.
CPC .. *H01L 23/49513* (2013.01); *H01L 23/49562* (2013.01); *H01L 23/49568* (2013.01); *H01L 23/49575* (2013.01)

(58) Field of Classification Search
CPC ......... H01L 23/49568; H01L 23/49575; H01L 24/32; H01L 24/48; H01L 24/73; H01L 24/37; H01L 25/072; H01L 23/043; H01L 23/3135; H01L 24/40; H01L 2224/0603; H01L 2224/32245; H01L 2224/3701; H01L 2224/40245; H01L 2224/45014; H01L 2224/48091; H01L 2224/48247; H01L 2224/73221; H01L 2224/73265; H01L 2924/00014; H01L 2924/181; H01L 23/295; H01L 25/18; B62D 5/04; B62D 5/0406; H02M 7/003; H02M 7/5387; H02M 7/48; H10D 30/60; H10D 62/81; H10D 30/668

USPC ........................................................ 257/622
See application file for complete search history.

(56) References Cited

U.S. PATENT DOCUMENTS

| | | | |
|---|---|---|---|
| 10,759,467 B2* | 9/2020 | Sonoda | ................ H02K 11/215 |
| 2006/0017141 A1 | 1/2006 | Luo et al. | |
| 2008/0158830 A1 | 7/2008 | Tominaga et al. | |
| 2008/0224323 A1* | 9/2008 | Otremba | ........... H01L 23/49575 |
| | | | 257/E23.141 |
| 2017/0338201 A1 | 11/2017 | Shimakawa et al. | |
| 2019/0123034 A1 | 4/2019 | Nakamura | |
| 2020/0023886 A1* | 1/2020 | Yatsugi | ................ B62D 5/0406 |
| 2022/0247283 A1* | 8/2022 | Miyachi | ................... H02K 9/22 |

* cited by examiner

SEMICONDUCTOR MODULE WITH NON-COMMON WIRING ELECTRODE AND COMMON WIRING REGION

CROSS REFERENCE TO RELATED APPLICATION

The present application is a continuation application of International Patent Application No. PCT/JP2020/037024 filed on Sep. 29, 2020, which designated the U.S. and claims the benefit of priority from Japanese Patent Applications No. 2019-181704 filed on Oct. 1, 2019, and No. 2020-160930 filed on Sep. 25, 2020. The entire disclosures of all of the above applications are incorporated herein by reference.

TECHNICAL FIELD

The present disclosure relates to a semiconductor module including a plurality of semiconductor elements.

BACKGROUND

A conceivable technique teaches a semiconductor module in which six semiconductor elements are included in one resin mold. In this semiconductor module, the six semiconductor elements are power transistors and function as switching elements in the upper or lower arms of the U, V, W phases.

SUMMARY

According to an example, a semiconductor module may include: semiconductor elements having a gate electrode, a first electrode and a second electrode; a resin mold; and conductive members connected to at least one of the semiconductor elements and having a common wiring electrode exposed from the resin mold and connected to the first electrode or the second electrode and a non-common wiring electrode exposed from the resin mold and connected to an electrode of the semiconductor element different from the common wiring electrode. A width of a common wiring connected to the common wiring electrode is wider than the non-common wiring electrode. The common wiring is arranged from one side to an opposite side on a surface of the resin mold, on which the common wiring electrode is exposed, without being electrically connected to the non-common wiring electrode.

BRIEF DESCRIPTION OF THE DRAWINGS

The above and other objects, features and advantages of the present disclosure will become more apparent from the following detailed description made with reference to the accompanying drawings. In the drawings.

DETAILED DESCRIPTION

Figure 1:
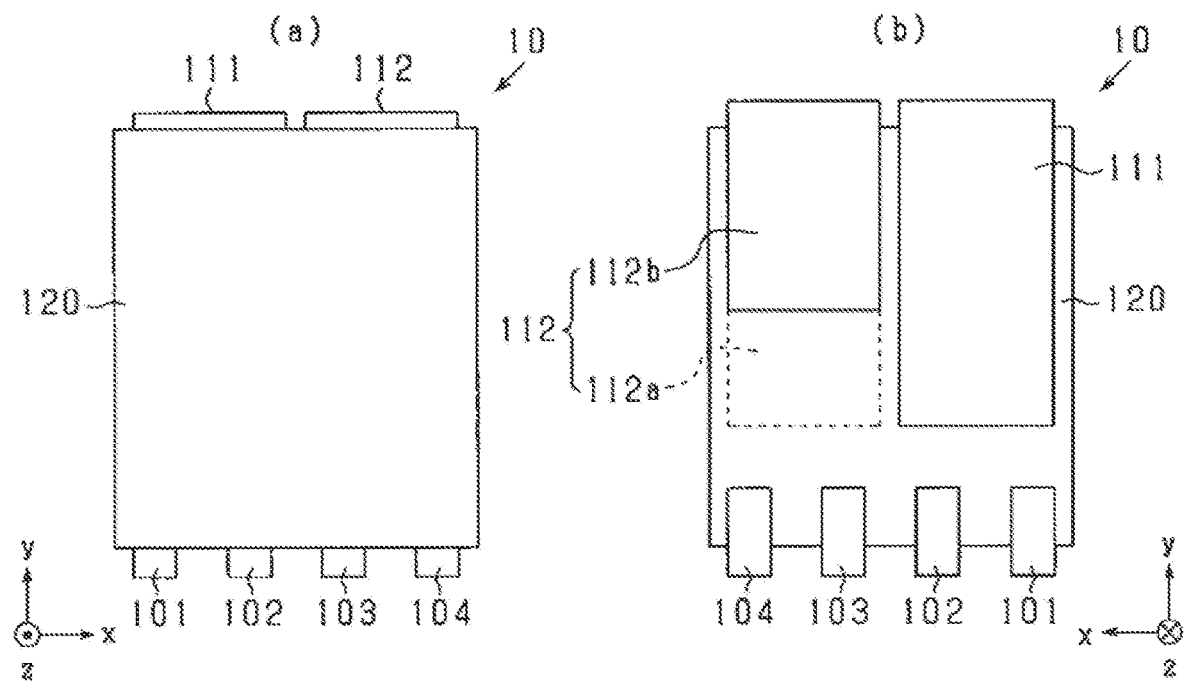
FIG. 1 is a plan view showing a semiconductor module according to a second embodiment.

In a conceivable technique, in order to connect three semiconductor elements, a wiring is retrieved in a plane direction on the side of the semiconductor element, and the semiconductor element is connected on the side from which the wiring is retrieved. Therefore, in the mounting board on which the semiconductor modules are mounted, it is necessary to secure a space for the wiring for connecting the semiconductor modules to each other on the side of the semiconductor modules. Ensuring this space may limit the downsizing of the mounting board.

In view of the above, a technique is provided to be capable of reducing the wiring space on the side of the semiconductor module.

The present embodiments provide a semiconductor module including: a plurality of semiconductor elements, a resin mold for integrally encapsulating the plurality of semiconductor elements, and a plurality of conductive members electrically connected to at least one of the plurality of semiconductor elements. In this semiconductor module, the semiconductor element is an insulated gate type semiconductor element having a gate electrode, a first electrode, and a second electrode, in which a carrier moves from the side of the first electrode to the side of the second electrode in the semiconductor element through a channel formed by applying a voltage to the gate electrode. The plurality of conductive members include: a common wiring electrode that is exposed from the resin mold on the upper surface side or the lower surface side of the semiconductor module, and is electrically connected to at least one of the first electrode and the second electrode; and a non-common wiring that is exposed from the resin mold and is electrically connected an electrode of the semiconductor element different from the common wiring electrode. The wiring width of the common wiring connected to the common wiring electrode is wider than the wiring width of the non-common wiring electrode. When the common wiring is connected to the common wiring electrode, the plurality of semiconductor elements and the plurality of conductive members are disposed so as to arrange the common wiring from one opposite side to the other side on the surface of the resin mold, on which the common wiring electrode is exposed, without being electrically connected to the non-common wiring electrode.

According to the present embodiments, the semiconductor module includes a common wiring electrode exposed from the resin mold on the upper surface side or the lower surface side thereof, and a non-common wiring electrode connected to an electrode of a semiconductor element different from the common wiring electrode. Then, when the common wiring is connected to the common wiring electrode, the plurality of semiconductor elements and the plurality of conductive members are arranged so as to arrange the common wiring from one opposite side to the other side on the surface of the resin mold, on which the common wiring electrode is exposed, without being electrically connected to the non-common wiring electrode. Therefore, for example, by arranging a plurality of semiconductor modules according to the present disclosure adjacent to each other and by connecting the common wiring electrodes to each other by the common wiring, the plurality of semiconductor modules can be electrically connected to each other in the vertical direction of the semiconductor module. As a result, the wiring space on the side of the semiconductor module can be reduced, which can contribute to the downsizing of the mounting board. Further, in order to connect a plurality of semiconductor elements, it is possible to omit the wiring taken out to the side of the semiconductor module. As a result, the wiring area is reduced, the wiring resistance is reduced, and heat generation due to wiring can be suppressed.

First Embodiment

As shown in FIGS. 1 to 5, a semiconductor module 10 according to a first embodiment includes a first semiconductor element 133 and a second semiconductor element 143, a resin mold 120 for integrally sealing the first semiconductor element 133 and the second semiconductor element 143, conductive members 101-104, and conductive members 111, 112, 131, 141. An x-axis direction and a y-axis direction shown in FIGS. 1 to 5 are sides of the semiconductor module 10, and an xy-plane direction is a plane direction of the semiconductor module 10. The z-axis direction is a vertical direction orthogonal to the plane direction.

As shown in (a) of FIG. 1, the semiconductor module 10 has an outline shape in which four external terminals protrude in the negative direction of the y-axis from the resin mold 120 having a substantially rectangular shape when viewed from above, and two external terminals protrude in the positive direction of the y-axis. The four external terminals are a part of the conductive members 101 to 104 exposed from the resin mold 120, and the two external terminals are a part of the conductive members 111 and 112 exposed from the resin mold 120.

Further, as shown in (b) of FIG. 1, when the semiconductor module 10 is viewed from the lower surface, the entire lower surfaces of the conductive members 101 to 104 and the conductive member 111 are exposed from the resin mold 120. The conductive member 112 includes a low step portion 112a that is not exposed from the resin mold 120 and a high step portion 112b that is exposed from the resin mold 120.

The resin mold 120 is made of a high heat radiation resin material obtained by mixing a resin material such as an epoxy resin with a filler or the like for improving heat radiation. As the filler used for the high heat radiation resin material, for example, a composite oxide material having high thermal conductivity such as alumina is selected. The thermal conductivity of the resin mold 120 can be adjusted by adjusting the type and filling rate of the filler.

Figure 2:
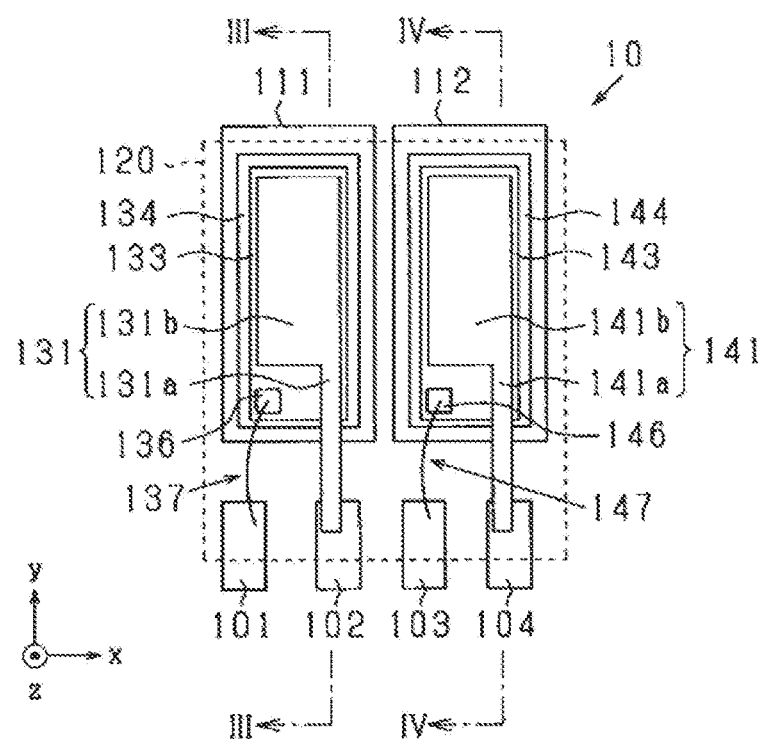
FIG. 2 is a plan view showing a state in which the resin mold is removed in the semiconductor module shown in FIG. 1.
Figure 3:
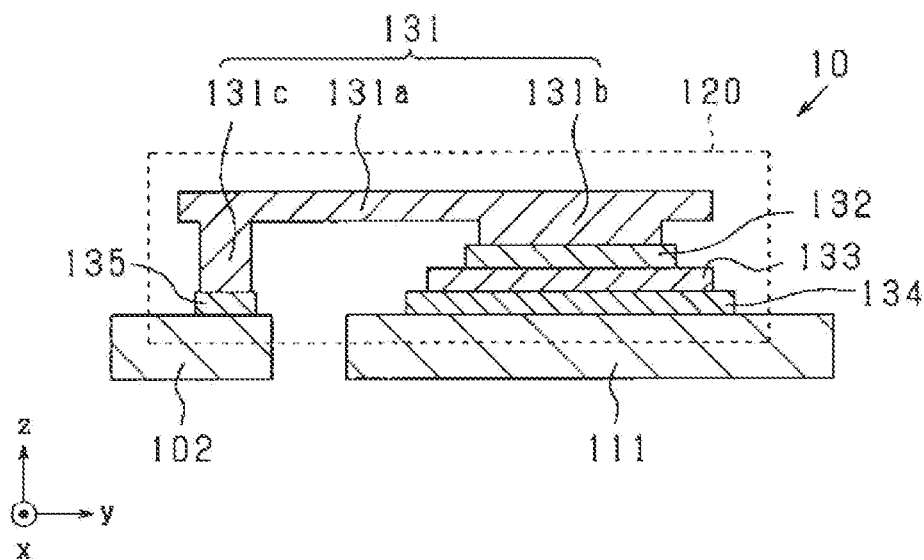
FIG. 3 is a cross sectional view taken along the line III-III of FIG. 2.
Figure 4:
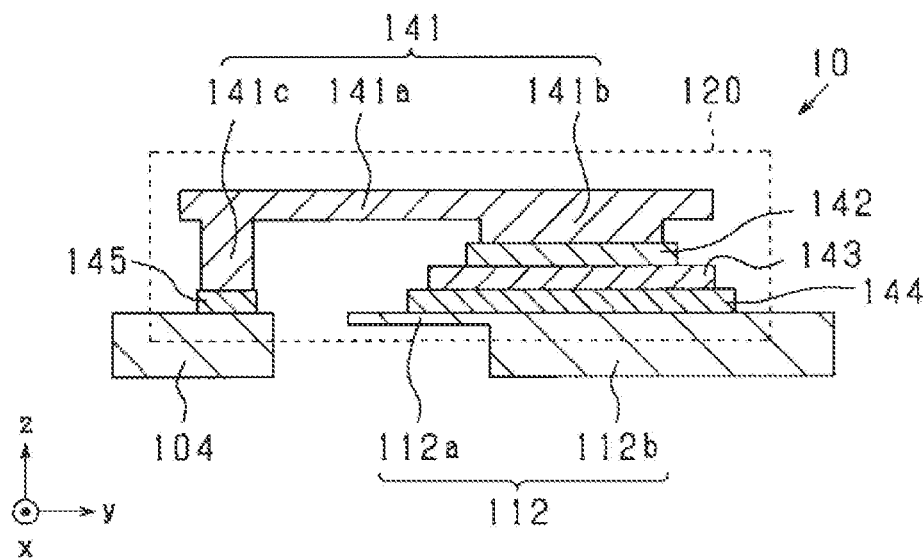
FIG. 4 is a cross-sectional view taken along line IV-IV of FIG. 2.

FIGS. 2 to 4 show each configuration in the resin mold 120 of the semiconductor module 10. In FIGS. 2 to 4, the position where the resin mold 120 is provided is shown by a broken line.

As shown in FIGS. 2 to 4, in the resin mold 120, the first semiconductor element 133 and the second semiconductor element 143 are integrally sealed in a state of being arranged side by side in the x direction in the same direction. The first semiconductor element 133 and the second semiconductor element 143 are semiconductor elements having the same structure, shape, size, and the like, and have a substantially rectangular shape when viewed from the top. The gate pad 136 of the first semiconductor element 133 and the gate pad 146 of the second semiconductor element 143 are provided at the same position in each semiconductor element. The first semiconductor element 133 and the second semiconductor element 143 are arranged substantially in parallel with the adjacent semiconductor element in the same direction as the adjacent semiconductor element.

Figure 6:
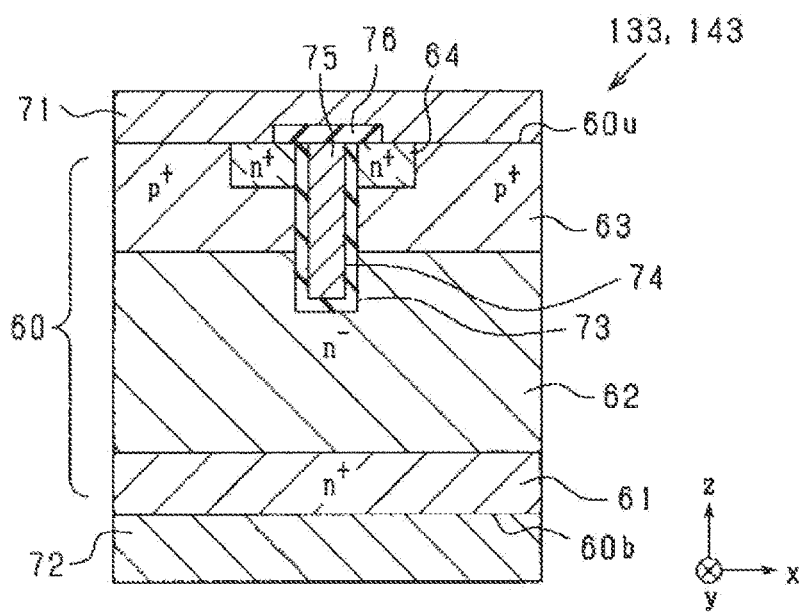
FIG. 6 is a cross-sectional view showing an element structure of a semiconductor element in the semiconductor module shown in FIG. 1.

The first semiconductor element 133 and the second semiconductor element 143 are vertical insulated gate semiconductor elements having an element structure as shown in FIG. 6. More specifically, the first semiconductor element 133 and the second semiconductor element 143 are power MOSFETs (Metal-Oxide-Semiconductor Field-Effect Transistors: MOSFETs).

The first semiconductor element 133 and the second semiconductor element 143 each include a semiconductor substrate 60, a source electrode 71, and a drain electrode 72. The source electrode 71 is formed in contact with an upper surface 60u of the semiconductor substrate 60. The drain electrode 72 is formed in contact with a lower surface 60b of the semiconductor substrate 60. The upper surface 60u corresponds to the first surface, and the lower surface 60b corresponds to the second surface. In the semiconductor substrate 60, an n+ region 61, an n− region 62, and a p+ region 63 are stacked on each other in this order from the lower surface 60b side. An n+ region 64 is formed in a part of the p+ region 63 on the upper surface side. A trench 73 is provided to penetrate from the upper surface 60u of the semiconductor substrate 60 through the n+ region 64 and the p+ region 63, and reaches an upper surface side of the n− region 62. A gate insulation film 74 is formed on an inner wall surface of the trench 73, and a gate electrode 75 is filled in the trench 73 in a state of being insulated from the semiconductor substrate 60 by the gate insulation film 74. An upper surface of the gate electrode 75 is covered with an insulation film 76, and the gate electrode 75 and the source electrode 71 are insulated from each other by the insulation film 76. A material of the semiconductor substrate 60 is not particularly limited, silicon (Si), silicon carbide (SiC), gallium nitride (GaN), or the like may be exemplified.

When a positive voltage is applied to the gate electrode 75 of each of the first semiconductor element 133 and the second semiconductor element 143, an n-type channel is provided in the p+ region 63 along the gate insulation film 74, and n-type carriers move from the source electrode 71 to the drain electrode 72 in the semiconductor substrate 60. As a result, a current flows from the drain electrode 72 to the source electrode 71. In other words, in the first semiconductor element 133 and the second semiconductor element 143, a gate voltage applied to the gate electrode 75 is controlled, thereby being capable of performing on/off control of switching elements of the first semiconductor element 133 and the second semiconductor element 143. The source electrode 71 corresponds to a first electrode, and the source terminal electrically connected to the source electrode 71 among the external terminals corresponds to a first terminal. The drain electrode 72 corresponds to a second electrode, and a drain terminal electrically connected to the drain electrode 72 among the external terminals corresponds to a second terminal.

The first semiconductor element 133 and the second semiconductor element 143 are arranged so that the longitudinal direction is the y direction when viewed from above when the source electrode 71 faces upward (positive direction of the z-axis) and the drain electrode faces downward (negative direction of the z-axis), respectively.

As shown in FIGS. 2 and 3, on the first semiconductor element 133 side, the conductive member 131, the bonding member 132, the first semiconductor element 133, the bonding member 134, and the conductive member 111 are arranged in this order from above. The conductive member 131 includes a beam-shaped portion 131a, a pad portion 131b, and a columnar portion 131c. The pad portion 131b is located on the upper surface side of the first semiconductor element 133, and is a substantially rectangular portion having a size of the upper surface similar to that of the first semiconductor element 133. The beam-shaped portion 131a extends in the negative direction of the y-axis along the long side of the upper surface of the substantially rectangular shape of the pad portion 131b, and extends above the conductive member 102. The columnar portion 131c extends downward from the beam-shaped portion 131a, and its lower end surface is bonded to the upper surface of the conductive member 102 via the bonding member 135. The conductive member 101 is electrically connected to the gate pad 136 by the gate wiring 137.

As shown in FIGS. 2 and 4, on the second semiconductor element 143 side, the conductive member 141, the bonding member 142, the second semiconductor element 143, the bonding member 144, and the conductive member 112 are arranged in this order from above. The conductive member 141 includes a beam-shaped portion 141a, a pad portion 141b, and a columnar portion 141c. The pad portion 141b is located on the upper surface side of the second semiconductor element 143, and is a substantially rectangular portion having a size of the upper surface similar to that of the second semiconductor element 143. The beam-shaped portion 141a extends in the negative direction of the y-axis along the long side of the upper surface of the substantially rectangular shape of the pad portion 141b, and extends above the conductive member 104. The columnar portion 141c extends downward from the beam-shaped portion 141a, and its lower end surface is bonded to the upper surface of the conductive member 104 via the bonding member 145. The conductive member 103 is electrically connected to the gate pad 146 by the gate wiring 147. The gate wirings 137 and 147 are so-called clips, alternatively, wire bonding, wire ribbons, and the like may be used in addition to the clips.

The conductive members 101 and 102 correspond to the gate terminal and the source terminal of the first semiconductor element 133, and the conductive member 111 corresponds to the drain pad of the first semiconductor element 133. The conductive members 103 and 104 correspond to the gate terminal and the source terminal of the second semiconductor element 143, and the conductive member 112 corresponds to the drain pad of the second semiconductor element 143.

As shown in FIGS. 1 to 4, the high step portion 112*b* of the conductive member 112 is exposed from the resin mold 120, while the low step portion 112*a* is not exposed from the resin mold 120. Therefore, when the semiconductor module 10 is viewed from the bottom, the portion exposed from the resin mold 120 of the drain pad (i.e., the conductive member 112) of the second semiconductor element 143 has an area smaller than the part exposed from the resin mold 120 of the drain pad (i.e., the conductive member 111) of the first semiconductor element 133. Between the exposed high step portion 112*b* and the conductive members 103 and 104, there is a region where nothing is exposed on the surface of the resin mold 120 because the low step portion 112*a* is covered with the resin mold 120. This area corresponds to the common wiring area.

Figure 5:
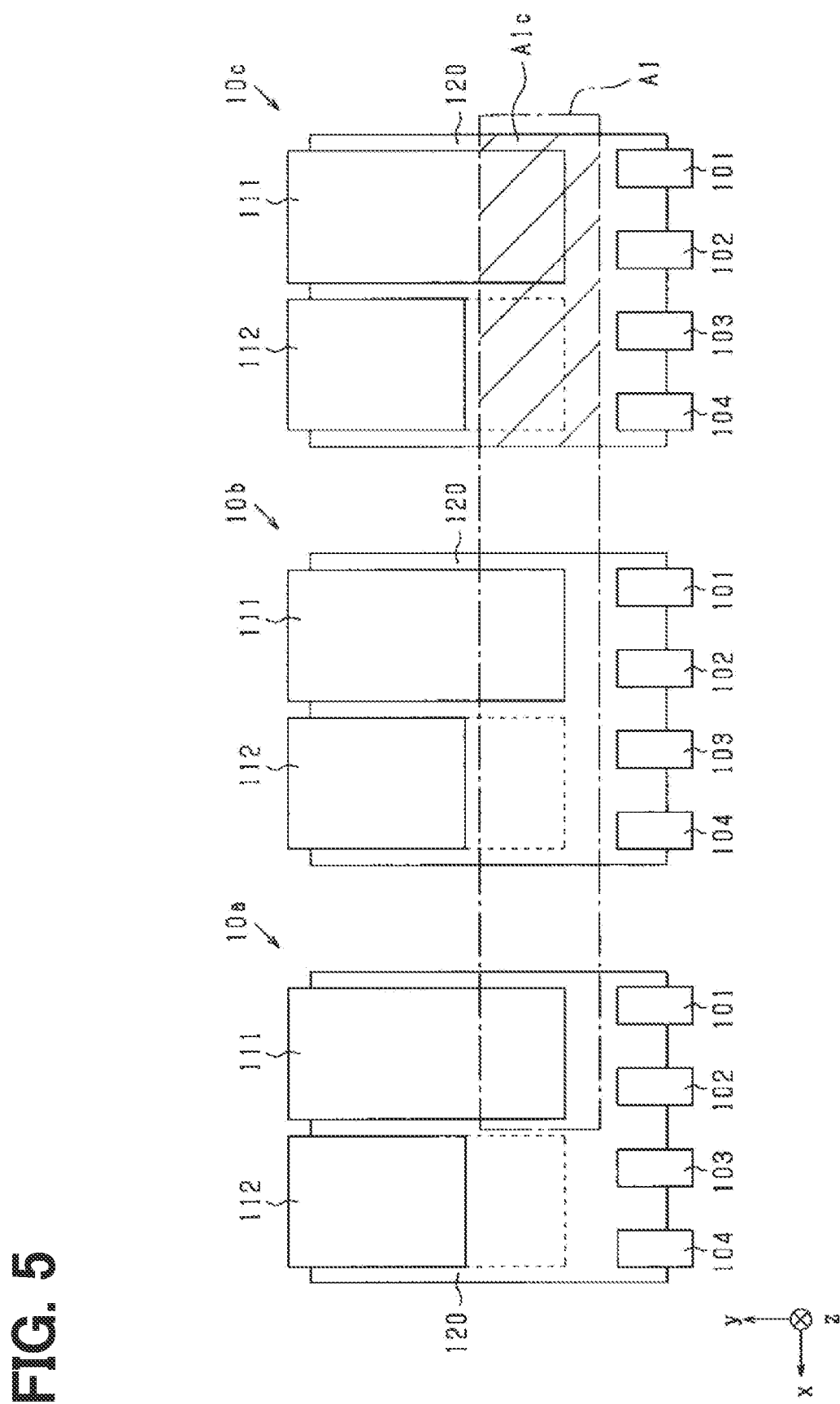
FIG. 5 is a diagram in which a plurality of semiconductor modules shown in FIG. 1 are arranged side by side.

As shown in FIGS. 1 to 5, in the resin mold 120 having a substantially rectangular shape when the semiconductor module 10 is viewed from the bottom, a region where the low step portion 112*a* and a portion of the conductive portion 111 adjacent to the step portion 112*a* are included is located between the long sides opposing in the x direction. Therefore, as shown in FIG. 5, when the three semiconductor modules 10 are arranged side by side in the same direction along the x direction so as to be substantially orthogonal to the long sides opposing the x direction, the region A1 extending straight along the x direction in a strip shape is secured. In FIG. 5, reference numbers of 10*a*, 10*b*, and 10*c* are assigned in order from the positive direction side of the x-axis at the arrangement positions. The region A1*c* shown in FIG. 5 indicates a common wiring region A1*c* of the semiconductor module 10*c*. The common wiring region A1*c* is a strip-shaped region that extends substantially straight from one opposite side to the other on the surface of the resin mold 120 on which the conductive member 111 is exposed. The conductive member 111 exists in the common wiring region A1*c*, and no conductive member (such as the conductive member 112 or the like) other than the conductive member 111 exists therein. Although not shown, the semiconductor modules 10*a* and 10*b* also have the same common wiring area as the common wiring area A1*c*. The width in the direction (i.e., they direction) orthogonal to the wiring direction (i.e., the x direction) of the common wiring area A1*c* is such that the width in which the wiring can be installed is secured, and for example, the width is wider than the installation interval of the conductive members 101 to 104 (i.e., the interval in the x direction).

The region A1 is included in an area including the common wiring region of the semiconductor modules 10*a* to 10*c* and an area connecting between them. This region A1 extends over three semiconductor modules 10*a*, 10*b*, and 10*c*, and in the region A1, only the conductive member 111 is exposed from the resin mold 120. Therefore, by installing the common wiring connected to the three conductive members 111 respectively included in the three semiconductor modules 10*a*, 10*b*, and 10*c* in the region A1, the three conductive members 111 are electrically connected to each other. The wiring width of the common wiring (i.e., the width in the y direction orthogonal to the x direction, which is the wiring direction) is wider than the wiring width (i.e., the width in the x direction) of the conductive members 101 to 104, and the width of the region A1 in the y direction is secured sufficiently to arrange the common wiring.

Of the above conductive members, the conductive members 101 to 104, 111, 112 are exposed from the resin mold 120 on the upper surface side or the lower surface side of the semiconductor module 10. Of the conductive members 101 to 104, 111, 112, the conductive member 111 corresponds to the common wiring electrode, and the conductive members 101 to 104, 112 correspond to the non-common wiring electrode. The common wiring electrode is exposed from the resin mold 120 on the upper surface side (i.e., the positive direction side of the z-axis) or the lower surface side (i.e., the negative direction side of the z-axis) of the semiconductor module 10, and is an electrode electrically connected to at least one of the first electrode (i.e., the source electrode 71) and the second electrode (i.e., the drain electrode 72). The common wiring electrode is connected to the common wiring when the semiconductor module 10 is connected to another semiconductor module by the common wiring.

As described with reference to FIG. 5, by arranging the common wiring across the region A1, the common wiring is disposed from one side facing the x-axis direction to the other side on the lower surface of the resin mold 120 without not being electrically connected to the non-common wiring electrode (i.e., the conductive members 101 to 104, 112).

That is, in the semiconductor module 10, when the common wiring is connected to the common wiring electrode (i.e., the conductive member 111), each configuration (i.e., a plurality of semiconductor elements, a plurality of conductive members, and the like) constituting the semiconductor module 10 is arranged so that the common wiring is not electrically connected to the non-common wiring electrode (i.e., the conductive members 101 to 104, 112), and the common wiring is arranged from one side to the other opposite side on the surface of the resin mold on which the common wiring electrode is exposed. Therefore, the plurality of semiconductor modules 10 can be electrically connected to each other on the lower surface side of the semiconductor module 10. As a result, the wiring space on the side of the semiconductor module 10 can be reduced, which can contribute to the downsizing of the mounting board. Further, in order to connect a plurality of semiconductor elements, it is possible to omit the wiring taken out to the side of the semiconductor module. As a result, the wiring area is reduced, the wiring resistance is reduced, and heat generation due to wiring can be suppressed. Furthermore, since the resin mold 120 is made of a high heat radiation resin material, heat radiation of the semiconductor module 10 can be promoted via the resin mold 120.

The semiconductor module 10 can be applied to a drive circuit of an electric power steering system (EPS) 80 of a vehicle as shown in FIG. 6. The EPS 80 includes a steering wheel 90, a steering shaft 91, a pinion gear 92, a rack shaft 93, and an EPS device 81. The steering shaft 91 is connected to the steering wheel 90. The pinion gear 92 is provided at a tip of the steering shaft 91. The pinion gear 92 is engaged with the rack shaft 93. Wheels 95 are rotatably connected to both ends of the rack shaft 93 through tie rods or the like. When a driver rotates the steering wheel 90, the steering shaft 91 rotates. The pinion gear 92 converts rotary motion of the steering shaft 91 to linear motion of the rack shaft 93, and the wheels 95 are steered to have a steering angle according to displacement of the rack shaft 93.

The EPS device 81 includes a torque sensor 94, a speed reducer 96, a rotary electric machine 82, and an energization circuit unit 83. The torque sensor 94 is provided on the steering shaft 91, and detects a steering torque Trq which is an output torque of the steering shaft 91. The rotary electric machine 82 generates an assisting torque corresponding to the detected steering torque Trq and a steering direction of the steering wheel 90. The energization circuit unit 83 performs a drive control of the rotary electric machine 82. The speed reducer 96 transmits the assisting torque to the steering shaft 91 while reducing the rotation of a rotation shaft of a rotor of the rotary electric machine 82.

Figure 8:
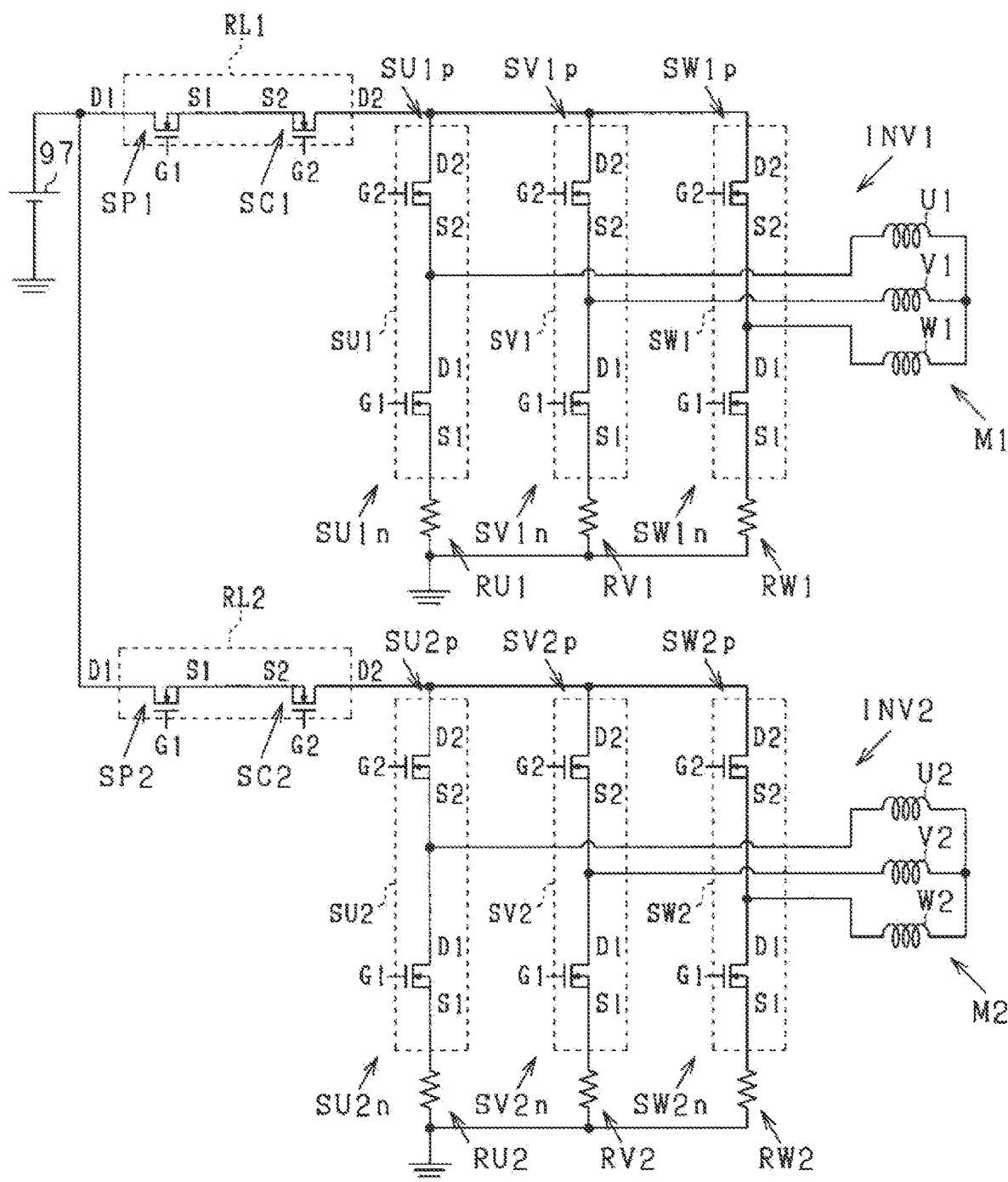
FIG. 8 is a diagram showing a drive circuit of an electric power steering system to which the semiconductor module shown in FIG. 1 is applied.

As shown in FIG. 8, a permanent magnet field type or a winding field type can be used as the rotary electric machine 82. A stator of the rotary electric machine 82 includes a first winding group M1 and a second winding group M2. The first winding group M1 includes a star-connected first U-phase winding U1, a first V-phase winding V1, and a first W-phase winding W1, and the second winding group M2 includes a star-connected phase second U-phase winding U2, a second V-phase winding V2, and a second W-phase winding W2. Respective first ends of the first U-phase winding U1, the first V-phase winding V1, and the first W-phase winding W1 are connected to each other at a neutral point. The first U-phase winding U1, the first V-phase winding V1, and the first W-phase winding W1 are shifted by 120° at an electric angle $\theta$e. Respective first ends of the second U-phase winding U2, the second V-phase winding V2, and second W-phase winding W2 are connected to each other at a neutral point. The second U, V, and W-phase coils U2, V2, and W2 are shifted from one another by 120 degrees in terms of the electrical angle $\theta$e.

The energization circuit unit 83 includes a first inverter INV1 and a second inverter INV2 as power converters, and a first relay RL1 and a second relay RL2 as power supply relays.

In the first inverter INV1, a second end of the first U-phase winding U1 is connected to a connection point between an upper arm switch SU1$p$ and a lower arm switch SU1$n$ of a first U phase. A second end of the first V-phase winding V1 is connected to a connection point between an upper arm switch SV1$p$ and a lower arm switch SV1$n$ of a first V phase. A second end of the first W-phase winding W1 is connected to a connection point between an upper arm switch SW1$p$ and a lower arm switch SW1$n$ of a first W phase. In the second inverter INV2, a second end of the second U-phase winding U1 is connected to a connection point between an upper arm switch SU2$p$ and a lower arm switch SU2$n$ of a second U phase. A second end of the second V-phase winding V2 is connected to a connection point between an upper arm switch SV2$p$ and a lower arm switch SV2$n$ of a second V phase. A second end of the second W-phase winding W2 is connected to a connection point between an upper arm switch SW2$p$ and a lower arm switch SW2$n$ of a second W phase.

The high-potential side terminals of the upper arm switch SU1$p$ of the first U phase, the upper arm switch SV1$p$ of the first V phase, the upper arm switch SW1$p$ of the first W-phase are connected to a positive electrode terminal of a battery 97, which is a DC power supply, through the first relay RL1. The low-potential side terminals of the lower arm switch SU1$n$ of the first U phase, the lower arm switch SV1$n$ of the first V phase, the lower arm switch SW1$n$ of the first W-phase are connected to the ground through resistors RU1, RV1, and RW1, respectively. The high-potential side terminals of the upper arm switch SU2$p$ of the second U phase, the upper arm switch SV2$p$ of the second V phase, and the upper arm switch SW2$p$ of the second W-phase are connected to a positive electrode terminal of the battery 97 through the second relay RL2. The low-potential side terminals of the lower arm switch SU2$n$ of the second U phase, the lower arm switch SV2$n$ of the second V phase, and the lower arm switch SW2$n$ of the second W-phase are connected to the ground through resistors RU2, RV2, and RW2, respectively. The negative electrode terminal of the battery 97 is connected to ground.

As the switches SU1$p$ to SW2$n$, a MOSFET exemplified by the first semiconductor element 133 and the second semiconductor element 143 can be used. Each of two switches SU1$p$ and SU1$n$, SV1$p$ and SV1$n$, SW1$p$ and SW1$n$, SU2$p$ and SU2$n$, SV2$p$ and SV2$n$, SW2$p$ and SW2$n$ connected in series in each arm are connected in series by connecting the source electrode of the former MOSFET and the drain electrode of the latter MOSFET.

The semiconductor module 10 can be used as semiconductor modules SU1, SV1, SW1, SU2, SV2, and SW2 in which two switches SU1$p$ and SU1$n$, SV1$p$ and SV1$n$, SW1$p$ and SW1$n$, SU2$p$ and SU2$n$, SV2$p$ and SV2$n$, and SW2$p$ and SW2$n$ connected in series in each arm are integrated together. A semiconductor module 10 can be applied to the first inverter INV1 and the second inverter INV2 to form an inverter circuit.

As the switches SP1 and SC1 configuring the power supply relay RL1 and the switches SP2 and SC2 configuring the power supply relay RL2, a MOSFET exemplified by the first semiconductor element 133 and the second semiconductor element 143 can be used. The switches SP1 and SP2 are power supply relay switches, and the switches SC1 and SC2 are reverse connection protective relays. The two switches SP1 and SC1, and SP2 and SC2 connected in series in each arm are connected in series by connecting the source electrodes of the MOSFETs to each other.

Figure 7:
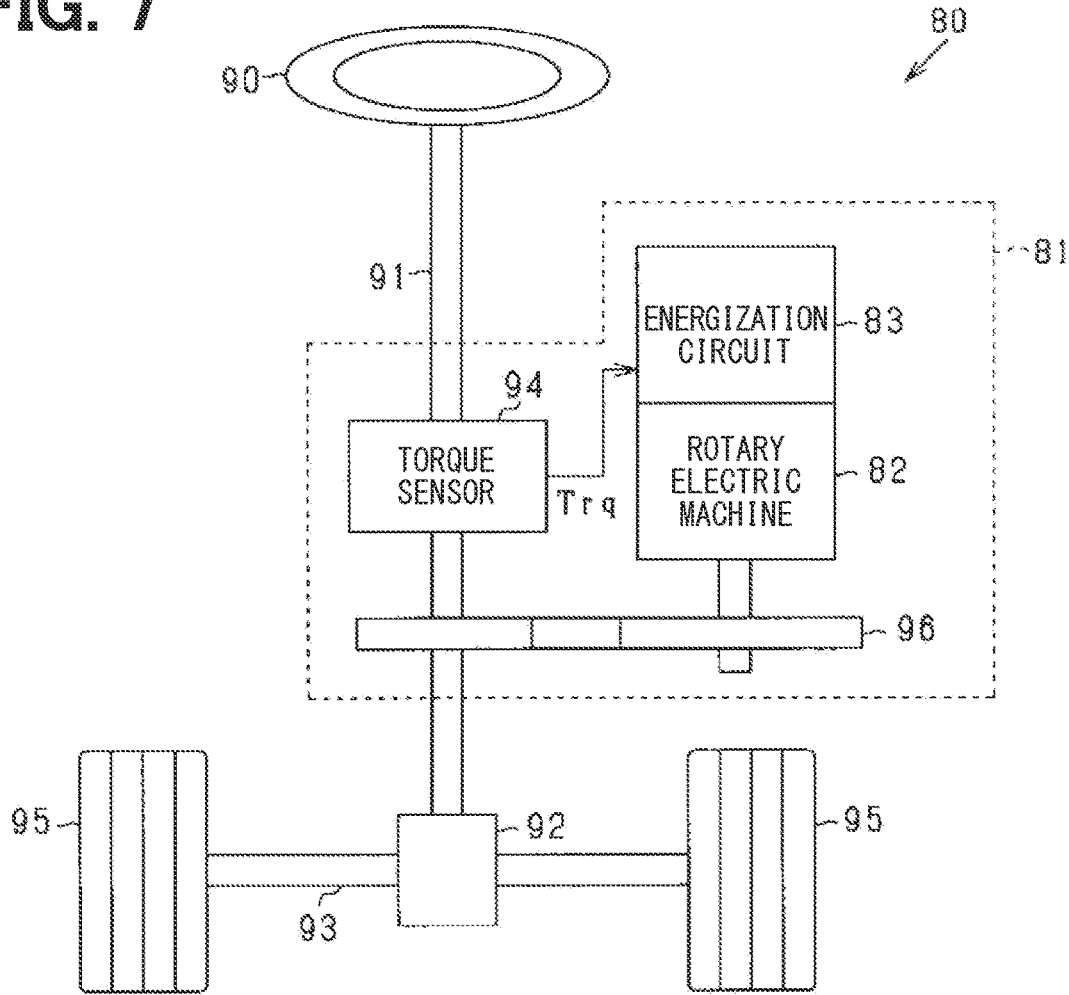
FIG. 7 is a schematic diagram of an electric power steering system to which the semiconductor module according to the first embodiment is applied.

When the MOSFETs such as the first semiconductor element 133 and the second semiconductor element 143 are used as the switches SU1$p$ to SW2$n$, SP1, SC1, SP2, and SC2, the body diodes of the MOSFETs can be used as freewheeling diodes. For that reason, in FIG. 7, the freewheeling diodes connected in anti-parallel to the respective switches SU1$p$ to SW2$n$, SP1, SC1, SP2, and SC2 are not shown, but the freewheeling diodes may be connected to the respective switches SU1$p$ to SW2$n$, SP1, SC1, SP2, and SC2.

The energization circuit unit 83 detects currents flowing through the resistors RU1, RV1, and RW1 and outputs the detected currents as a first U-phase current Iur1, a first V-phase current Ivr1, and a first W-phase current Iwr1. Further, the energization circuit unit 83 detects the currents flowing through the resistors RU2, RV2, and RW2 and outputs the detected currents as a second U-phase current Iur2, a second V-phase current Ivr2, and a second W-phase current Iwr2.

The energization circuit unit 83 includes an ECU mainly configured by a microcomputer, and the ECU operates the switches of the first inverter INV1 and the second inverter INV2 to control a torque of the rotary electric machine 82 to reach a torque command value Tr*. The torque command value Tr* is set based on, for example, a steering torque Trq detected by the torque sensor 94. The energization circuit unit 83 calculates an electric angle $\theta$e of the rotary electric machine 82 by the ECU based on an output signal of an angular sensor. As the angle sensor, for example, an angular sensor including a magnet which is a magnetic generation portion provided on a rotor side of the rotary electric machine 82 and a magnetic detection element provided close to the magnet can be exemplified. The functions provided by the ECU may be provided, for example, by software stored in a tangible memory device and a computer causing the software to be executed, hardware, or a combination of the software, the computer, and the hardware.

As described above, the semiconductor module 10 can be applied to the EPS 80, and can be applied to the energization circuit unit 83 corresponding to a drive circuit of the EPS 80 as the semiconductor modules SU1 to SW2 including two switches connected in series with each other.

Specifically, the semiconductor module 10 can be applied to each of inverter circuits shown as the first inverter INV1 and the second inverter INV2, and the first semiconductor element 133 and the second semiconductor element 143 are applied to the inverter circuit as switching elements connected in series with each other.

Modifications Examples

Figure 9:
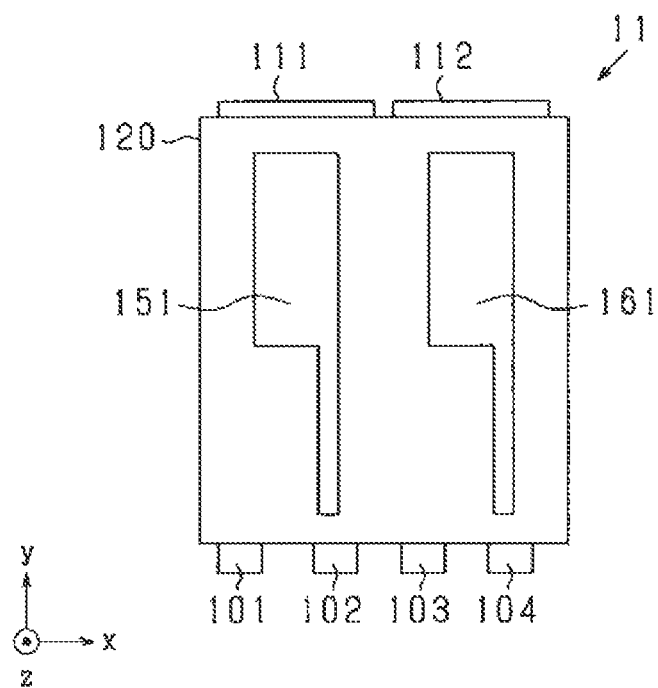
FIG. 9 is a plan view showing a semiconductor module according to a modified example.

As shown in (a) of FIG. 1, as the semiconductor module 10, the conductive members 131 and 141 have been described by way of example when they are not exposed from the resin mold 120, but the present embodiment may not be limited to this. Like the semiconductor module 11 shown in FIG. 9, the semiconductor module 11 may be provided with conductive members 151 and 161 protruding from the resin mold 120 on the upper surface side thereof. Other configurations in the semiconductor module 11 are the same as those of the semiconductor module 10, and therefore a description of those configurations will be omitted.

Figure 10:
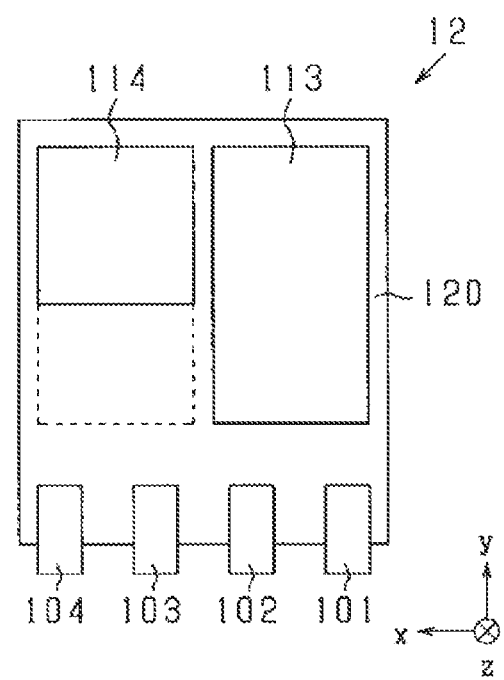
FIG. 10 is a plan view showing a semiconductor module according to a modified example.

Further, as shown in FIG. 1, as the semiconductor module 10, the conductive members 111 and 112 extend beyond the positive direction of the y-axis of the resin mold 120, but the present embodiment may not be limited to this. Like the semiconductor module 12 shown in FIG. 10, the resin mold 120 may include conductive members 113 and 114 that do not exceed the positive direction of the y-axis. Other configurations in the semiconductor module 12 are the same as those of the semiconductor module 10, and therefore a description of those configurations will be omitted.

Figure 11:
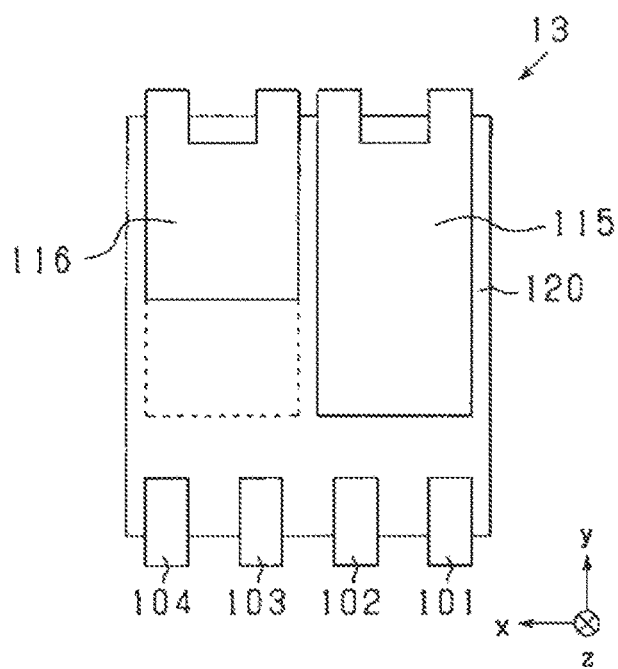
FIG. 11 is a plan view showing a semiconductor module according to a modified example.
Figure 12:
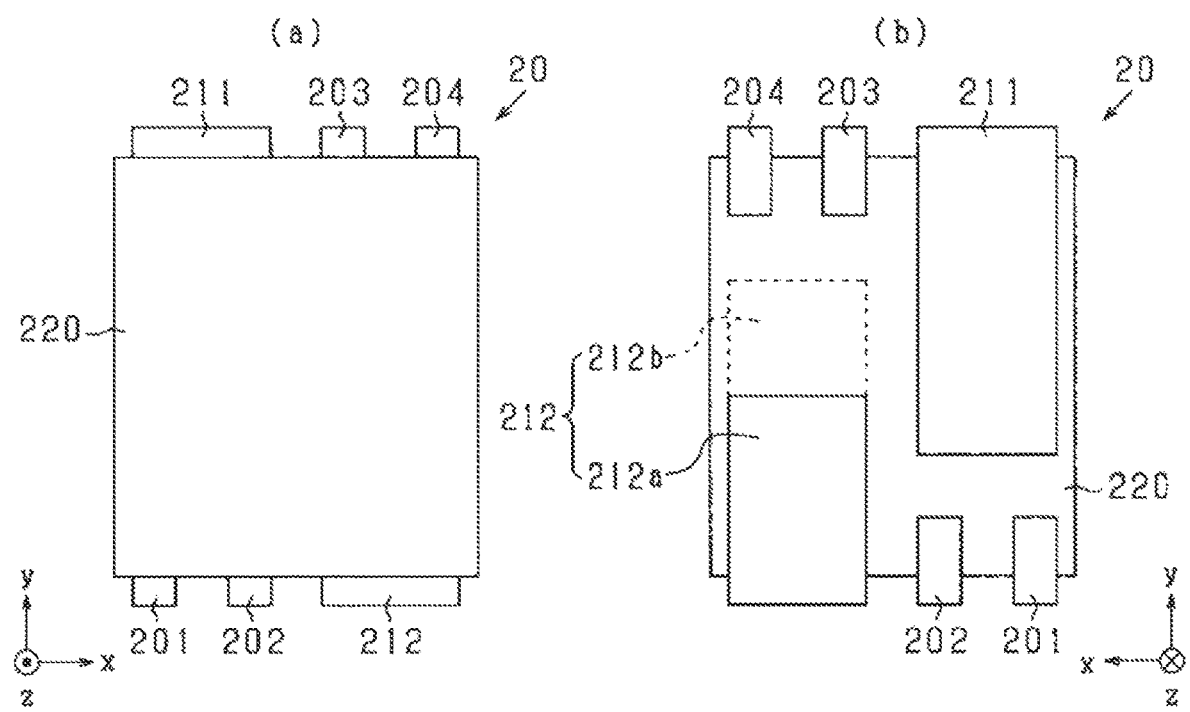
FIG. 12 is a plan view showing a semiconductor module according to a second embodiment.

Further, as in the semiconductor module 13 shown in FIG. 11, the conductive members 115 and 116 may be provided such that the portion thereof extending beyond the positive direction of the y-axis of the resin mold 120 is branched into two parts. Other configurations in the semiconductor module 13 are the same as those of the semiconductor module 10, and therefore a description of those configurations will be omitted.

Second Embodiment

In the first embodiment, a state in which a plurality of semiconductor elements (i.e., the first semiconductor element 133, and the second semiconductor element 143) are arranged substantially in parallel with adjacent semiconductor elements in the same direction as adjacent semiconductor elements is described. Alternatively, as in the second embodiment, the semiconductor elements may be arranged substantially point-symmetrically with the adjacent semiconductor elements in the opposite direction to the adjacent semiconductor elements.

In the semiconductor module 20 according to the second embodiment, as shown in FIGS. 12 to 15, in the resin mold 220, the second semiconductor element 243 is integrally sealed in a state where it is arranged side by side in the x-axis direction in a direction rotated by 180 degrees around the center of a vertical direction (i.e., the z direction) with respect to the first semiconductor element 233. That is, the first semiconductor element 233 and the second semiconductor element 243 are arranged substantially point-symmetrically with the adjacent semiconductor element in the opposite direction to the adjacent semiconductor element. As in the first embodiment, the first semiconductor element 233 and the second semiconductor element 243 are semiconductor elements having the same structure, shape, size, and the like. The material, shape, size, and the like of each configuration included in the semiconductor module 20 are the same as those of each configuration included in the semiconductor module.

Figure 13:
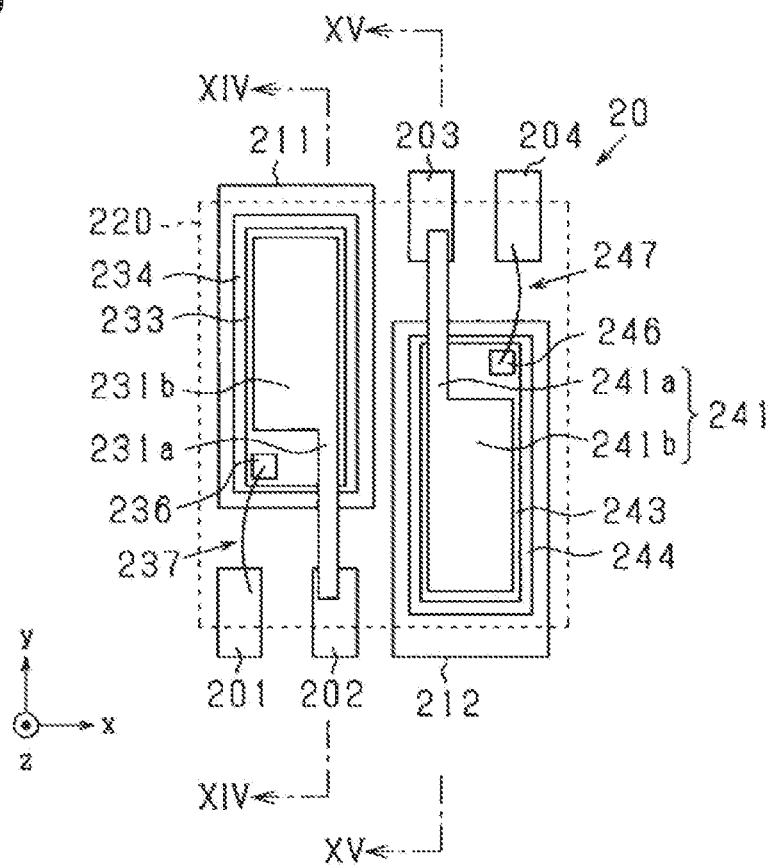
FIG. 13 is a plan view showing a state in which the resin mold is removed in the semiconductor module shown in FIG. 12.
Figure 14:
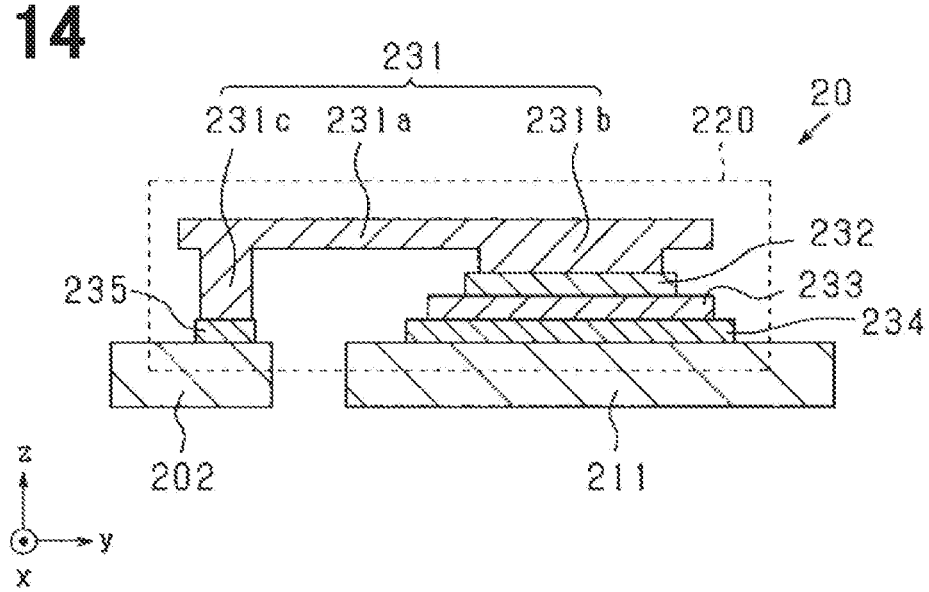
FIG. 14 is a cross-sectional view taken along a line XIV-XIV of FIG. 13.

As shown in FIGS. 13 and 14, each configuration on the first semiconductor element 233 side, that is, the conductive member 231 and the bonding member 232, the first semiconductor element 233, the bonding member 234, and the conductive member 211 are arranged in the same manner as each configuration on the first semiconductor element 133 side in the first embodiment. Thus, the description will be omitted by replacing the reference number in the 100s with the 200s.

Figure 15:
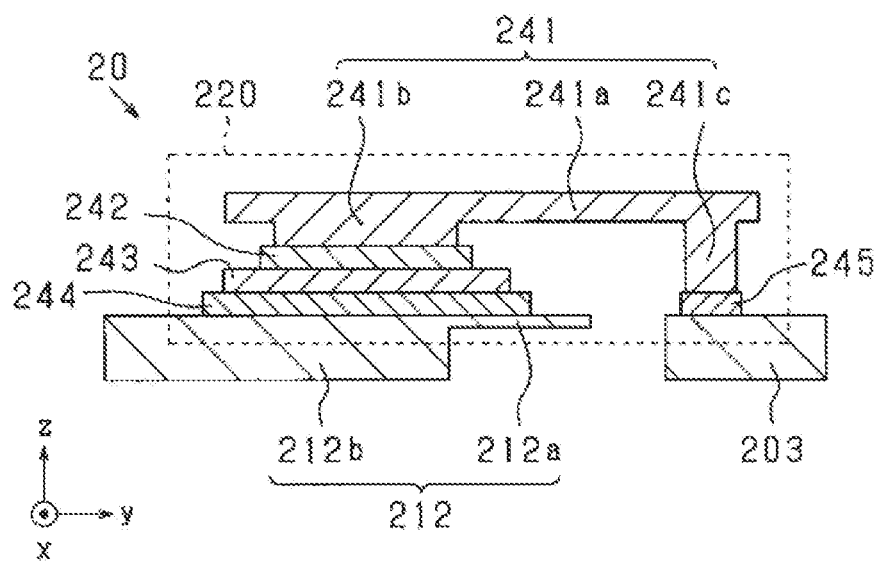
FIG. 15 is a cross-sectional view taken along line XV-XV in FIG. 13.

As shown in FIGS. 13 and 15, on the second semiconductor element 243 side, the conductive member 241, the bonding member 242, the second semiconductor element 243, the bonding member 244, and the conductive member 212 are arranged in this order from above, similar to the first embodiment. The conductive member 241 includes a beam-shaped portion 241a, a pad portion 241b, and a columnar portion 241c. The beam-shaped portion 241a extends in the positive direction of the y-axis along the long side of the upper surface of the substantially rectangular shape of the pad portion 241b, and extends above the conductive member 203. The columnar portion 241c extends downward from the beam-shaped portion 241a, and its lower end surface is bonded to the upper surface of the conductive member 203 via the bonding member 245. The conductive member 204 is electrically connected to the gate pad 246 by the gate wiring 247.

The conductive members 201 and 202 correspond to the gate terminal and the source terminal of the first semiconductor element 243, and the conductive member 212 corresponds to the drain pad of the first semiconductor element 233. The conductive members 203 and 204 correspond to the source terminal and the gate terminal of the second semiconductor element 243, and the conductive member 212 corresponds to the drain pad of the second semiconductor element 243.

As shown in FIGS. 12 to 15, the high step portion 212b of the conductive member 212 is exposed from the resin mold 220, while the low step portion 212a is not exposed from the resin mold 220. Therefore, when the semiconductor module 20 is viewed from the bottom, the portion exposed from the resin mold 220 of the drain pad (i.e., the conductive member 212) of the second semiconductor element 243 has an area smaller than the part exposed from the resin mold 220 of the drain pad (i.e., the conductive member 211) of the first semiconductor element 233. Between the exposed high step portion 212b and the conductive members 203 and 204, there is a region where nothing is exposed on the surface of the resin mold 220 because the low step portion 212a is covered with the resin mold 220. This area corresponds to the common wiring area.

Figure 16:
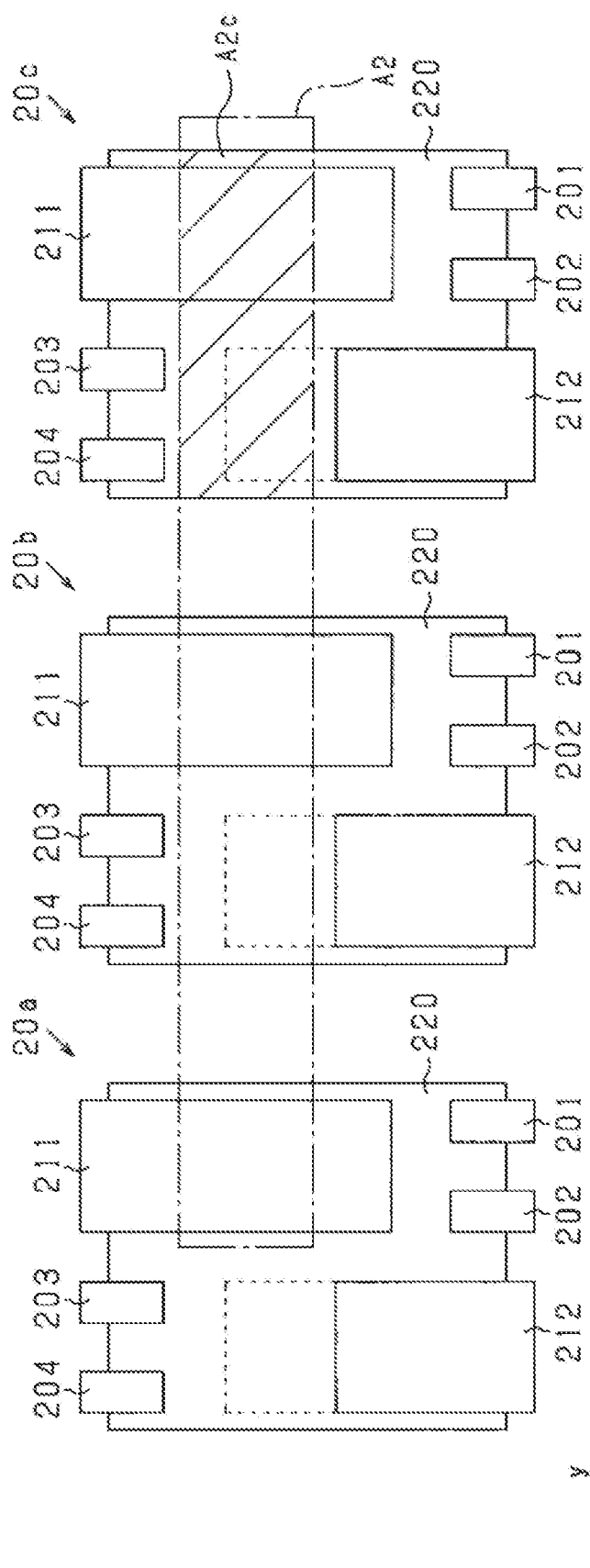
FIG. 16 is a diagram in which a plurality of semiconductor modules shown in FIG. 12 are arranged side by side.

As shown in FIGS. 12 to 16, in the resin mold 220 having a substantially rectangular shape when the semiconductor module 20 is viewed from the bottom, the low step portion 212a and a portion of the conductive portion 211 adjacent to the low step portion 212a are included between the long sides opposing in the x direction. Therefore, as shown in FIG. 16, when the three semiconductor modules 20 are arranged side by side in the same direction along the x direction so as to be substantially orthogonal to the long sides opposing the x direction, the region A2 extending straight along the x direction in a strip shape is secured. In FIG. 16, reference numbers of 20a, 20b, and 20c are assigned in order from the positive direction side of the x-axis at the arrangement positions. The region A2c shown in FIG. 16 indicates a common wiring region A2c of the semiconductor module 20c. The common wiring region A2c is a strip-shaped region that extends substantially straight from one opposite side to the other on the surface of the resin mold 220 on which the conductive member 211 is exposed. The conductive member 211 exists in the common wiring region A2c, and no conductive member other than the conductive member 211 exists. Although not shown, the semiconductor modules 20a and 20b also have the same common wiring area as the common wiring area A2c.

The region A2 is included in an area including the common wiring region of the semiconductor modules 20a to 20c and an area connecting between them. This region A2 extends over three semiconductor modules 20a, 20b, and 20c, and in the region A2, only the conductive member 211 is exposed from the resin mold 220. Therefore, by installing the common wiring connected to the three conductive members 211 respectively included in the three semiconductor modules 20a, 20b, and 20c in the region A2, the three conductive members 211 are electrically connected to each other.

Of the above conductive members, the conductive members 201 to 204, 211, 212 are exposed from the resin mold 220 on the upper surface side or the lower surface side of the semiconductor module 20. Of the conductive members 201 to 204, 211, 212, the conductive member 211 corresponds to the common wiring electrode, and the conductive members 201 to 204, 212 correspond to the non-common wiring electrode.

As shown in FIG. 16, by arranging the common wiring across the region A2, the common wiring is disposed from one side facing the x-axis direction to the other side on the lower surface of the resin mold 220 without not being electrically connected to the non-common wiring electrode (i.e., the conductive members 201 to 204, 212). The wiring width of the common wiring (i.e., the width in the y direction orthogonal to the x direction, which is the wiring direction) is wider than the wiring width (i.e., the width in the x direction) of the conductive members 201 to 204, and the width of the region A2 in the y direction is secured sufficiently to arrange the common wiring.

That is, similarly to the semiconductor module 10, in the semiconductor module 20, when the common wiring is connected to the common wiring electrode, each configuration (i.e., a plurality of semiconductor elements, a plurality of conductive members, and the like) constituting the semiconductor module 20 is arranged so that the common wiring electrode is exposed without being electrically connected to the non-common wiring electrode, and the common wiring can be arranged from one side to the other side opposite to the one side on the surface of the resin mold on which the common wiring electrode is exposed. Therefore, the plurality of semiconductor modules 20 can be electrically connected to each other on the lower surface side of the semiconductor module 20. As a result, the wiring space on the side of the semiconductor module 20 can be reduced, which can contribute to the downsizing of the mounting board. Further, in order to connect a plurality of semiconductor elements, it is possible to omit the wiring taken out to the side of the semiconductor element. As a result, the wiring area is reduced, the wiring resistance is reduced, and heat generation due to wiring can be suppressed. Furthermore, since the resin mold 220 is made of a high heat radiation resin material, heat radiation of the semiconductor module 20 can be promoted via the resin mold 220.

As described above, similar to the semiconductor module 10, the semiconductor module 20 can be applied to the EPS 80, and can be applied to the energization circuit unit 83 corresponding to a drive circuit of the EPS 80 as the semiconductor modules SU1 to SW2 including two switches connected in series with each other.

Modifications Examples

Figure 17:
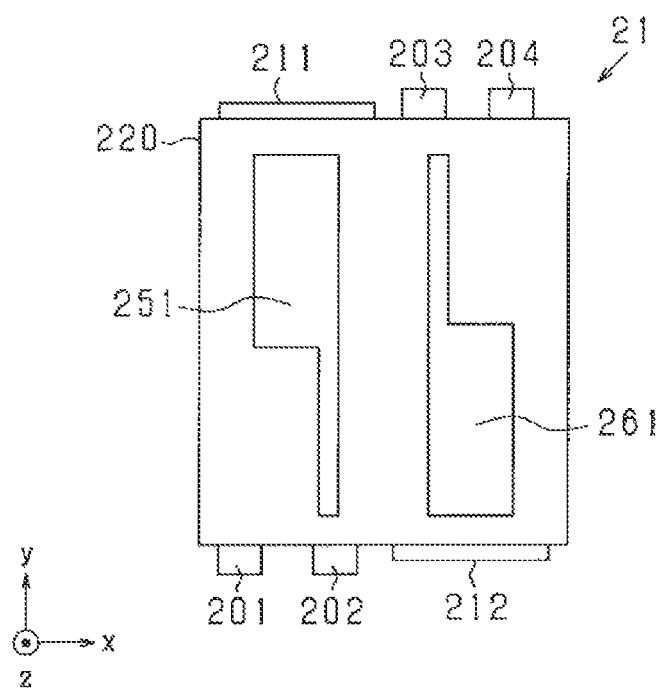
FIG. 17 is a plan view showing a semiconductor module according to a modified example.
Figure 18:
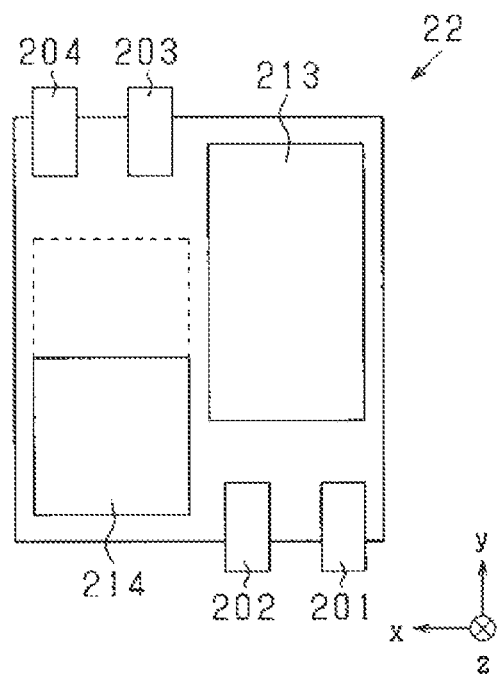
FIG. 18 is a plan view showing a semiconductor module according to a modified example.
Figure 19:
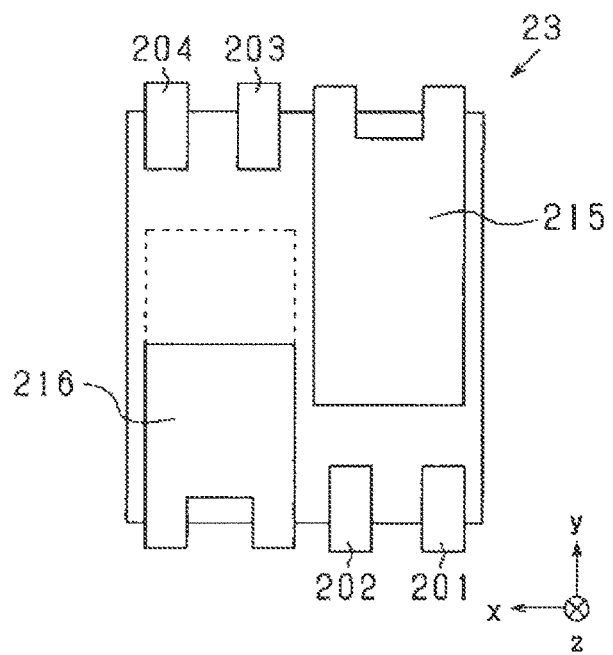
FIG. 19 is a plan view showing a semiconductor module according to a modified example.
Figure 20:
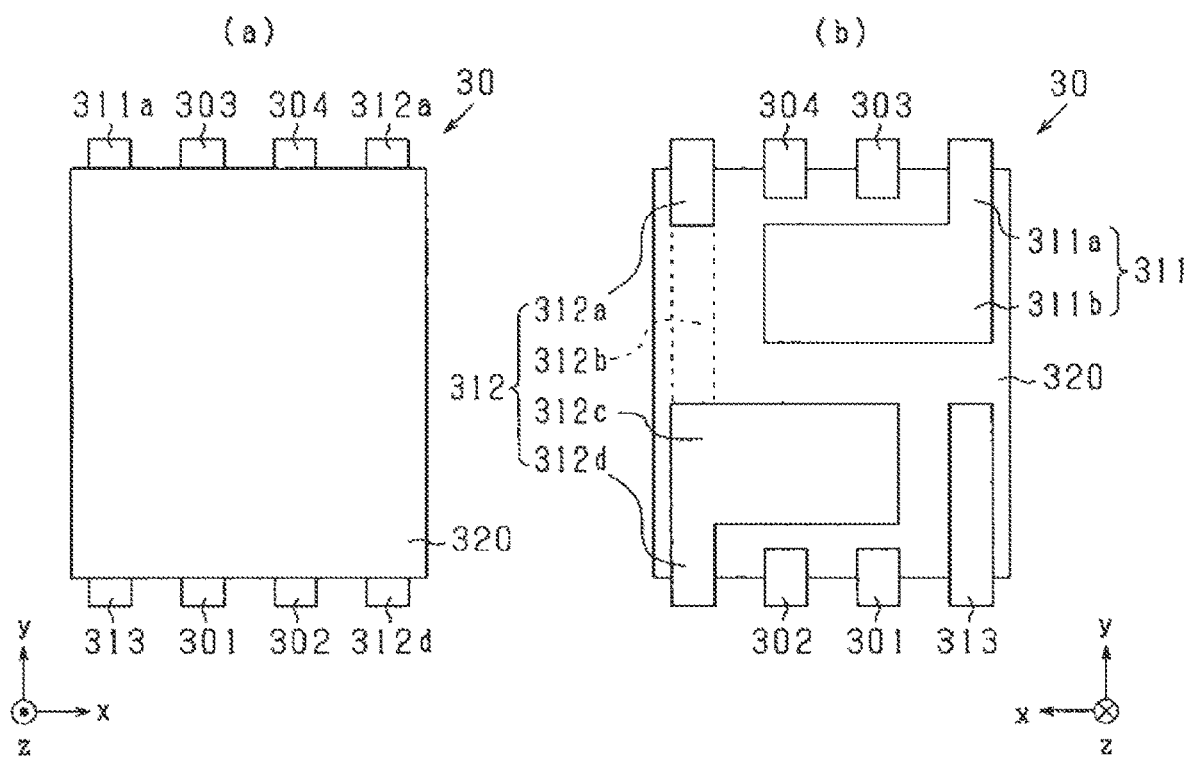
FIG. 20 is a plan view showing a semiconductor module according to a third embodiment.

Similar to the first embodiment, the semiconductor modules 21 to 23 shown in FIGS. 17 to 19 can be applied as modification examples in the second embodiment. For example, as in the semiconductor module 21 shown in FIG. 17, on the upper surface side thereof, the conductive members 251,261 protruding from the resin mold 220 may be provided instead of the conductive members 231,241.

Further, as in the semiconductor module 22 shown in FIG. 18, instead of the conductive members 211 and 212, the conductive members 213 and 214 that do not exceed the positive direction of the y-axis of the resin mold 220 may be provided.

Further, as in the semiconductor module 23 shown in FIG. 19, the conductive members 215 and 216 may be provided such that the portion thereof extending beyond the positive direction of the y-axis of the resin mold 220 is branched into two parts. Other configurations in the semiconductor modules 21 to 23 are the same as those of the semiconductor module 20, and therefore a description of those configurations will be omitted.

Third Embodiment

In the first embodiment and the second embodiment, the plurality of semiconductor elements are arranged side by side in the direction (i.e., the x direction) perpendicular to the direction (i.e., the y direction) in which the conductive member protrudes as the external terminal. Alternatively, the external terminal may be arranged side by side in the protruding direction.

In the semiconductor module 30 according to the second embodiment, as shown in FIGS. 20 to 23, in the resin mold 320, the second semiconductor element 343 is integrally sealed in a state where it is arranged side by side in the y-axis direction in a direction rotated by 180 degrees around the center of a vertical direction (i.e., the z direction) with respect to the first semiconductor element 333. That is, the first semiconductor element 333 and the second semiconductor element 343 are arranged substantially point-symmetrically with the adjacent semiconductor element in the opposite direction to the adjacent semiconductor element. As in the first embodiment, the first semiconductor element 333 and the second semiconductor element 343 are semiconductor elements having the same structure, shape, size, and the like. The first semiconductor element 333 and the second semiconductor element 343 are arranged so that the longitudinal direction when viewed from above is parallel to the x-axis.

Figure 21:
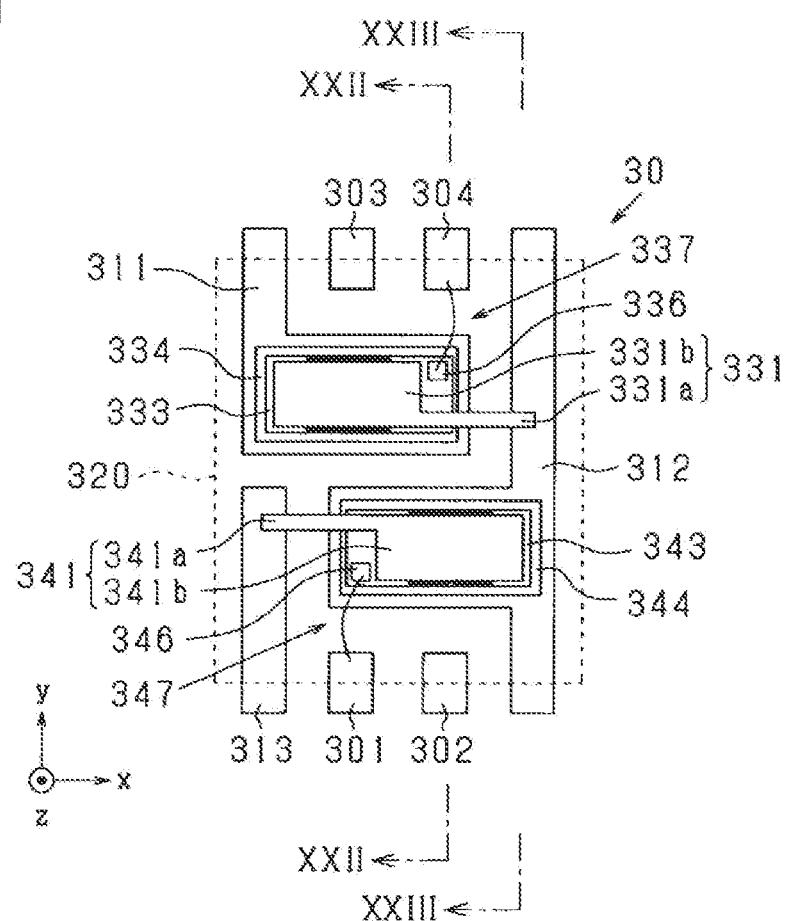
FIG. 21 is a plan view showing a state in which the resin mold is removed in the semiconductor module shown in FIG. 20.
Figure 22:
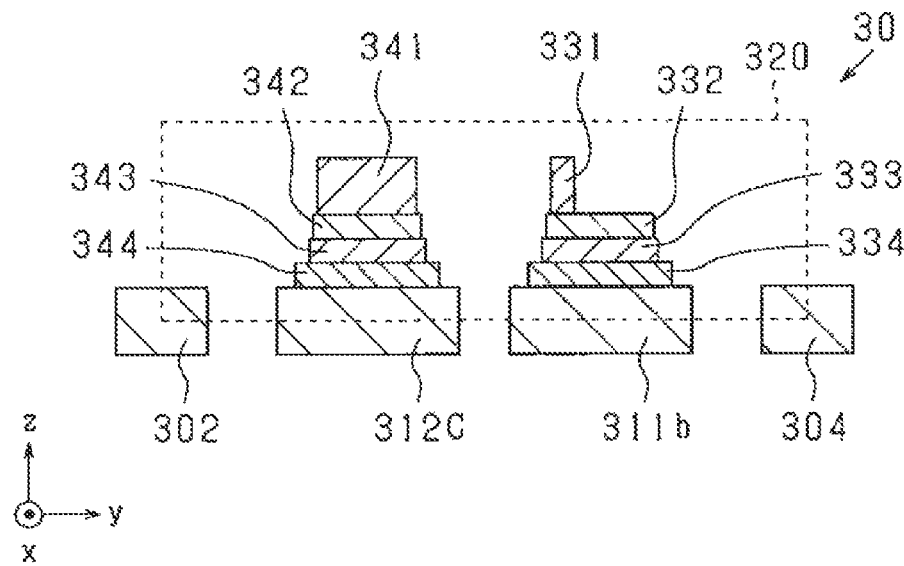
FIG. 22 is a cross-sectional view taken along a line XXII-XXII of FIG. 21.
Figure 23:
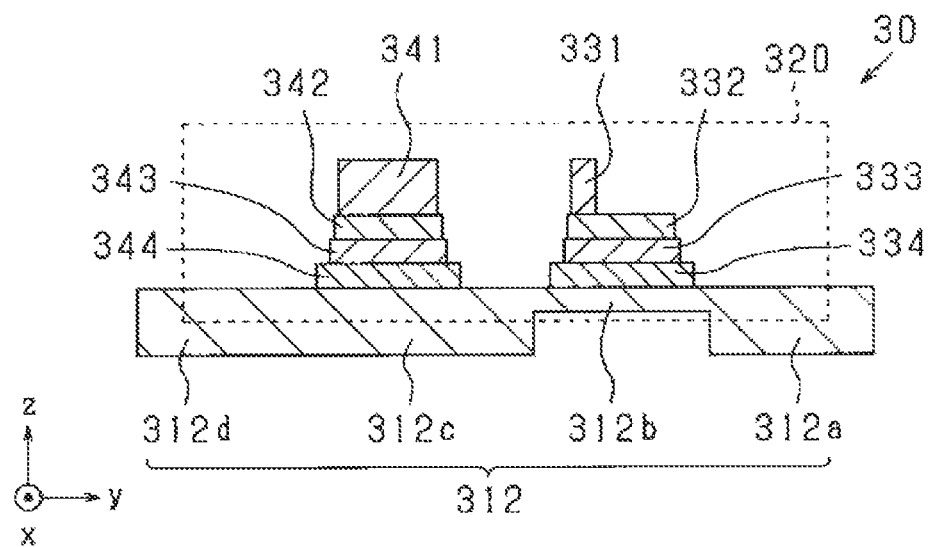
FIG. 23 is a cross-sectional view taken along a line XXIII-XXIII line of FIG. 21.

As shown in FIGS. 21 to 23, on the first semiconductor element 333 side, the conductive member 331, the bonding member 332, the second semiconductor element 333, the bonding member 334, and the conductive member 312 are arranged in this order from above, similar to the first embodiment. The conductive member 331 includes a beam-shaped portion 331a, a pad portion 331b, and a columnar portion 331c. The beam-shaped portion 331a extends in the positive direction of the x-axis along the long side of the upper surface of the substantially rectangular shape of the pad portion 331b, and extends above the conductive member 312. The columnar portion 331c extends downward from the beam-shaped portion 331a, and its lower end surface is bonded to the upper surface of the conductive member 312 via a bonding member (not shown). The conductive member 304 is electrically connected to the gate pad 346 by the gate wiring 347.

On the second semiconductor element 343 side, the conductive member 341, the bonding member 342, the second semiconductor element 343, the bonding member 344, and the conductive member 312 are arranged in this order from above. The conductive member 341 includes a beam-shaped portion 341a, a pad portion 341b, and a columnar portion 341c. The beam-shaped portion 341a extends in the negative direction of the x-axis along the long side of the upper surface of the substantially rectangular shape of the pad portion 341b, and extends above the conductive member 313. The columnar portion 341c extends downward from the beam-shaped portion 341a, and its lower end surface is bonded to the upper surface of the conductive member 313 via a bonding member (not shown). The conductive member 301 is electrically connected to the gate pad 346 by the gate wiring 347.

The conductive member 311 has a substantially L-shape, and includes a terminal portion 311a and an element mounting portion 311b. The first semiconductor element 333 is arranged in the element mounting portion 311b. The terminal portion 311a extends from the element mounting portion 311b in the positive direction of the y-axis and extends beyond the end portion of the resin mold 320 on the positive direction side of the y-axis.

The conductive member 312 includes a first terminal portion 312a, a low step portion 312b, an element mounting portion 312c, and a second terminal portion 312d. The second semiconductor element 343 is arranged in the element mounting portion 312c. The low step portion 312b and the first terminal portion 312a are elongated strip-shaped and substantially rectangular portions extending from the end of the element mounting portion 312c on the positive direction side of the x-axis toward the positive side of the y-axis, and the low step portion 312b is closer to the element mounting portion 312c. The second terminal portion 312d is a strip-shaped and substantially rectangular portion extending from the end portion of the element mounting portion 312c on the positive direction side of the x-axis to the negative direction side of the y-axis.

The conductive member 312 is in contact with the drain electrode of the second semiconductor element 343 via the bonding member 344 in the element mounting portion 312c and is electrically connected to the drain electrode. Further, the conductive member 312 is electrically connected to the source electrode of the first semiconductor element 333 at the low step portion 312b via the conductive member 331, the bonding member 332, and the like. That is, the conductive member 312 corresponds to the connection conductive member for connecting the first electrode (i.e., the source electrode) of the first semiconductor element 333 and the second electrode (i.e., the drain electrode) of the second semiconductor element 343 arranged adjacent to the first semiconductor element 333.

The conductive member 313 has an elongated strip shape and a substantially rectangular shape, and extends from the end on the positive side of the y-axis of the element mounting portion 312c of the conductive member 312 to beyond the end on the negative side of the y-axis of the resin mold 320.

The conductive members 304, 312 correspond to the gate terminal and the source terminal of the first semiconductor element 333, and the conductive member 311 corresponds to the drain pad of the first semiconductor element 333. The conductive members 301, 313 correspond to the gate terminal and the source terminal of the second semiconductor element 343, and the conductive member 312 corresponds to the drain pad of the second semiconductor element 343.

As shown in FIGS. 20 to 24, the first terminal portion 312a, the element mounting portion 312c, and the second terminal portion 312d of the conductive member 312 correspond to the high step portion and are exposed from the resin mold 320. The low step portion 312b is not exposed from the resin mold 320. Therefore, when the semiconductor module 30 is viewed from the bottom, it seems that the first terminal portion 312a and the element mounting portion 312c are not connected, while the second terminal portion 312d and the element mounting portion 312c are connected. The low step portion 312b is adjacent to a part of the element mounting portion 311b of the conductive member 311 in the x direction. Therefore, on the lower surface of the semiconductor module 30, the low step portion 312b is covered with the resin mold 320 between the exposed first terminal portion 312a and the element mounting portion 312c, so that an area not exposed on the surface of the resin mold 320 is disposed. This area corresponds to the common wiring area.

Figure 24:
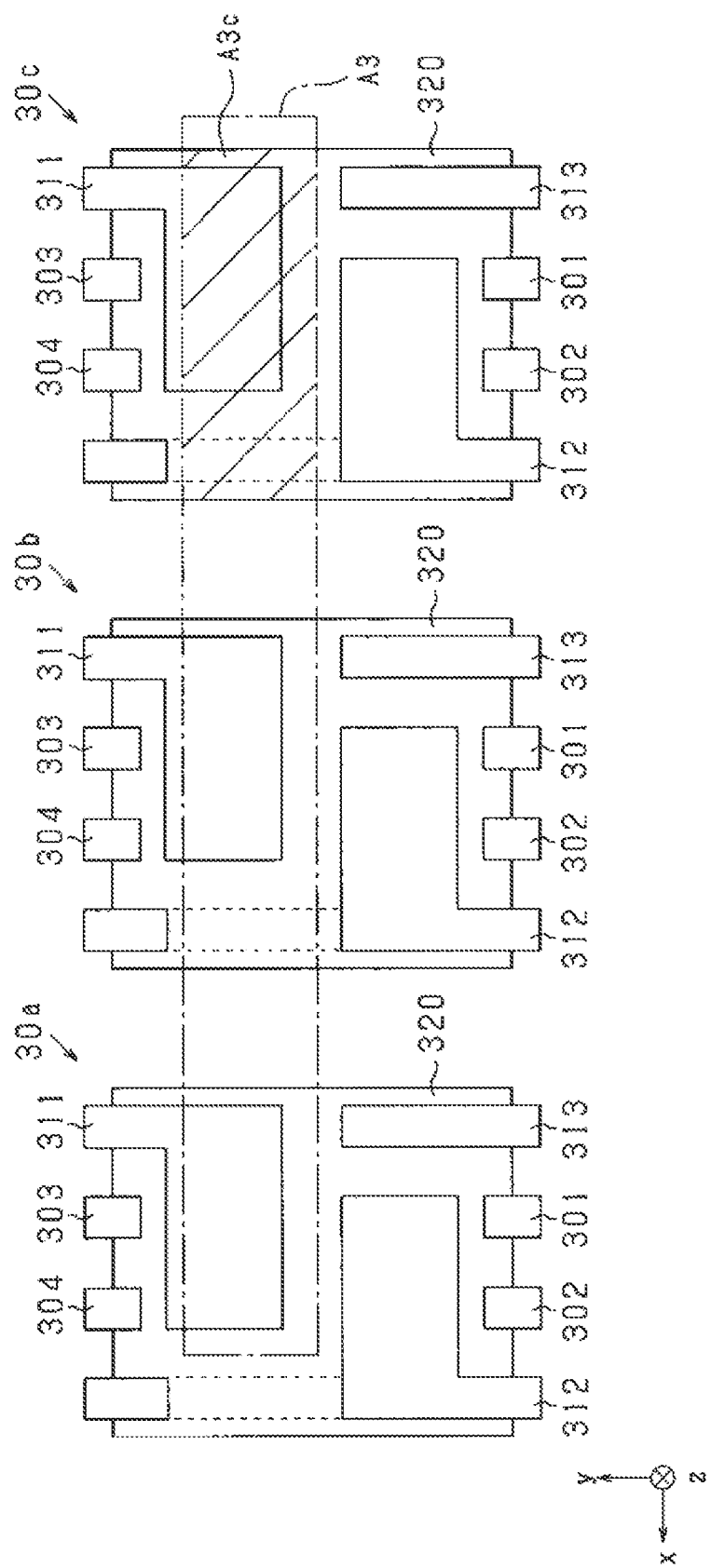
FIG. 24 is a diagram in which a plurality of semiconductor modules shown in FIG. 20 are arranged side by side.

As shown in FIGS. 20 to 24, in the resin mold 320 having a substantially rectangular shape when the semiconductor module 30 is viewed from the bottom, the low step portion 312a and a portion of the element mounting portion 311b of the conductive portion 311 adjacent to the low step portion 312a are included between the long sides opposing in the x direction. Therefore, as shown in FIG. 24, when the three semiconductor modules 30 are arranged side by side in the same direction along the x direction so as to be substantially orthogonal to the long sides opposing the x direction, the region A3 extending straight along the x direction in a strip shape is secured. In FIG. 24, reference numbers of 30a, 30b, and 30c are assigned in order from the positive direction side of the x-axis at the arrangement positions. The region A3c shown in FIG. 24 indicates a common wiring region A3c of the semiconductor module 30c. The common wiring region A3c is a strip-shaped region that extends substantially straight from one opposite side to the other on the surface of the resin mold 320 on which the conductive member 311 is exposed. The conductive member 311 exists in the common wiring region A3c, and no conductive member other than the conductive member 311 exists. Although not shown, the semiconductor modules 30a and 30b also have the same common wiring area as the common wiring area A3c.

The region A3 is included in an area including the common wiring region of the semiconductor modules 30a to 30c and an area connecting between them. This region A3 extends over three semiconductor modules 30a, 30b, and 30c, and in the region A3, only the conductive member 311 (more specifically, the element mounting portion 311b) is exposed from the resin mold 320. Therefore, by installing the common wiring connected to the three conductive members 311 respectively included in the three semiconductor modules 30a, 30b, and 30c in the region A3, the three conductive members 311 are electrically connected to each other.

Of the above conductive members, the conductive members 301 to 304, 311 to 313 are exposed from the resin mold 320 on the upper surface side or the lower surface side of the semiconductor module 30. Of the conductive members 301 to 304, 311 to 313, the conductive member 311 corresponds to the common wiring electrode, and the conductive members 301 to 304, 312, 313 correspond to the non-common wiring electrode.

As shown in FIG. 24, by arranging the common wiring across the region A3, the common wiring is disposed from one side facing the x-axis direction to the other side on the lower surface of the resin mold 320 without not being electrically connected to the non-common wiring electrode (i.e., the conductive members 301 to 304, 312, 313). The wiring width of the common wiring (i.e., the width in the y direction orthogonal to the x direction, which is the wiring direction) is wider than the wiring width (i.e., the width in the x direction) of the conductive members 301 to 304, and the width of the region A3 in the y direction is secured sufficiently to arrange the common wiring.

That is, similarly to the semiconductor modules 10, 20, in the semiconductor module 30, when the common wiring is connected to the common wiring electrode, each configuration (i.e., a plurality of semiconductor elements, a plurality of conductive members, and the like) constituting the semiconductor module 30 is arranged so that the common wiring electrode is exposed without being electrically connected to the non-common wiring electrode, and the common wiring can be arranged from one side to the other side opposite to the one side on the surface of the resin mold on which the common wiring electrode is exposed. Therefore, the plurality of semiconductor modules 30 can be electrically connected to each other on the lower surface side of the semiconductor module 30. As a result, the wiring space on the side of the semiconductor module 30 can be reduced, which can contribute to the downsizing of the mounting board. Further, in order to connect a plurality of semiconductor elements, it is possible to omit the wiring taken out to the side of the semiconductor element. As a result, the wiring area is reduced, the wiring resistance is reduced, and heat generation due to wiring can be suppressed. Furthermore, since the resin mold 320 is made of a high heat radiation resin material, heat radiation of the semiconductor module 30 can be promoted via the resin mold 320.

As described above, similar to the semiconductor module 10, the semiconductor module 30 can be applied to the EPS 80, and can be applied to the energization circuit unit 83 corresponding to a drive circuit of the EPS 80 as the semiconductor modules SU1 to SW2 including two switches connected in series with each other.

Modifications Examples

Figure 25:
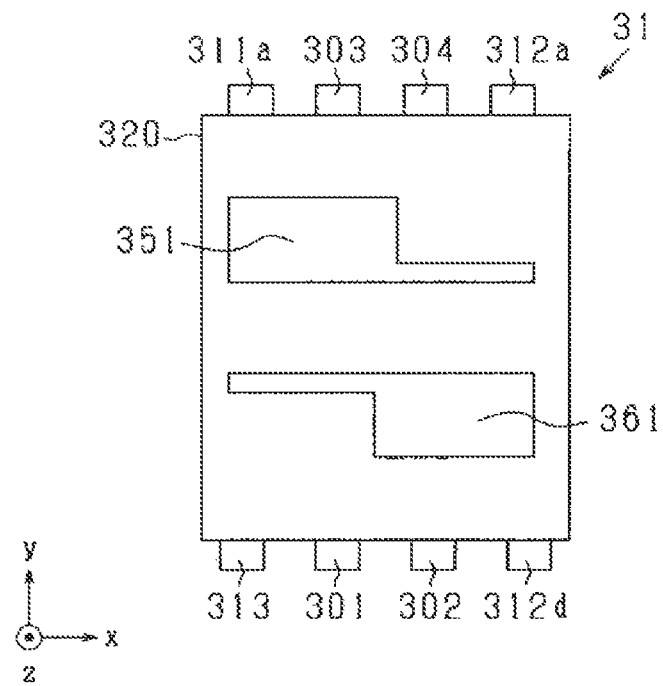
FIG. 25 is a plan view showing a semiconductor module according to a modified example.
Figure 26:
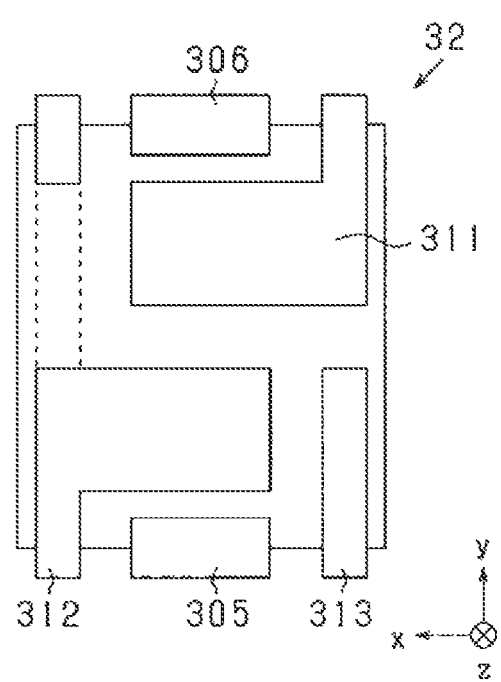
FIG. 26 is a plan view showing a semiconductor module according to a modified example.
Figure 27:
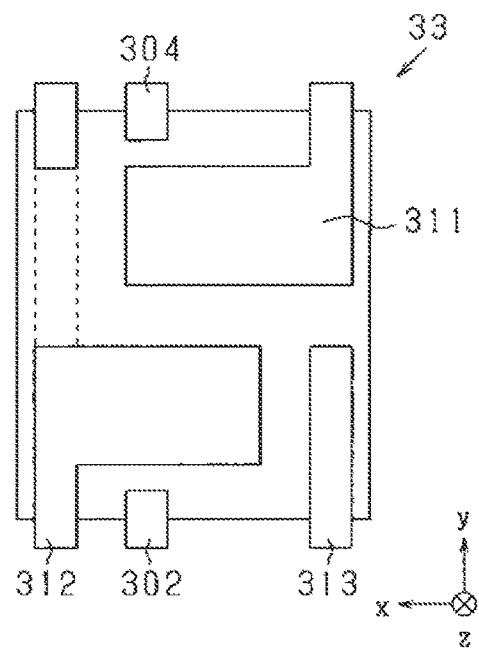
FIG. 27 is a plan view showing a semiconductor module according to a modified example.

Also in the third embodiment, the semiconductor modules 31 to 33 shown in FIGS. 25 to 27 can be applied as modification examples. For example, as in the semiconductor module 31 shown in FIG. 25, on the upper surface side thereof, the conductive members 351,361 protruding from the resin mold 320 may be provided instead of the conductive members 331, 341.

Further, as in the semiconductor module 32 shown in FIG. 26, the conductive member 305 that integrates the conductive members 301 and 302 may be provided instead of the conductive members 301 and 302. Similarly, instead of the conductive members 303 and 304, a conductive member 306 that integrates them may be provided. The conductive member 305 is a gate terminal of the first semiconductor element 333, and the conductive member 306 is a gate terminal of the second semiconductor element 343. Further, as in the semiconductor module 33 shown in FIG. 27, one of the conductive members 301 and 302 may not be provided. Further, one of the conductive members 303 and 304 may not be provided. The semiconductor module 33 is not provided with the conductive members 301 and 303. Other configurations in the semiconductor modules 31 to 33 are the same as those of the semiconductor module 30, and therefore a description of those configurations will be omitted.

Fourth Embodiment

In the first embodiment, the conductive member 112 corresponding to the non-common wiring electrode has a high step portion 112b higher toward the lower surface side exposed from the resin mold 120 and a low step portion 112a lower than the high step portion 112b. This allows the common wiring to be arranged. Alternatively, it may not be limited to this feature.

Figure 28:
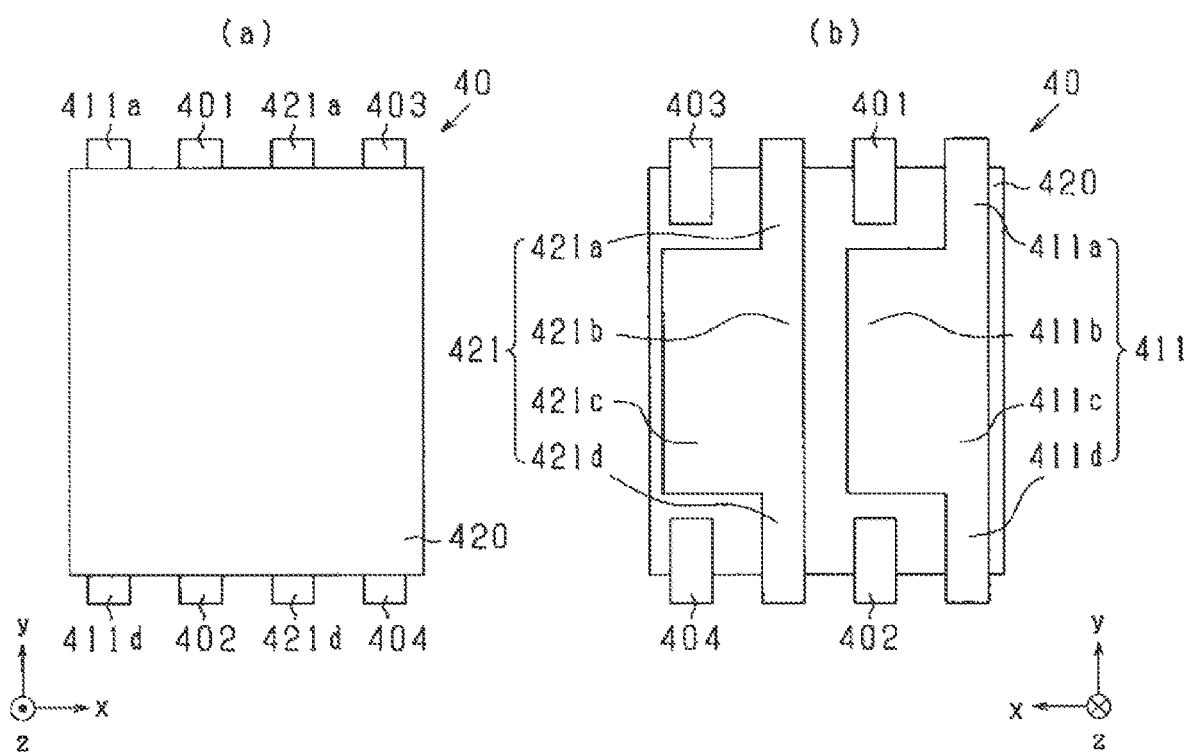
FIG. 28 is a plan view showing a semiconductor module according to a fourth embodiment.
Figure 29:
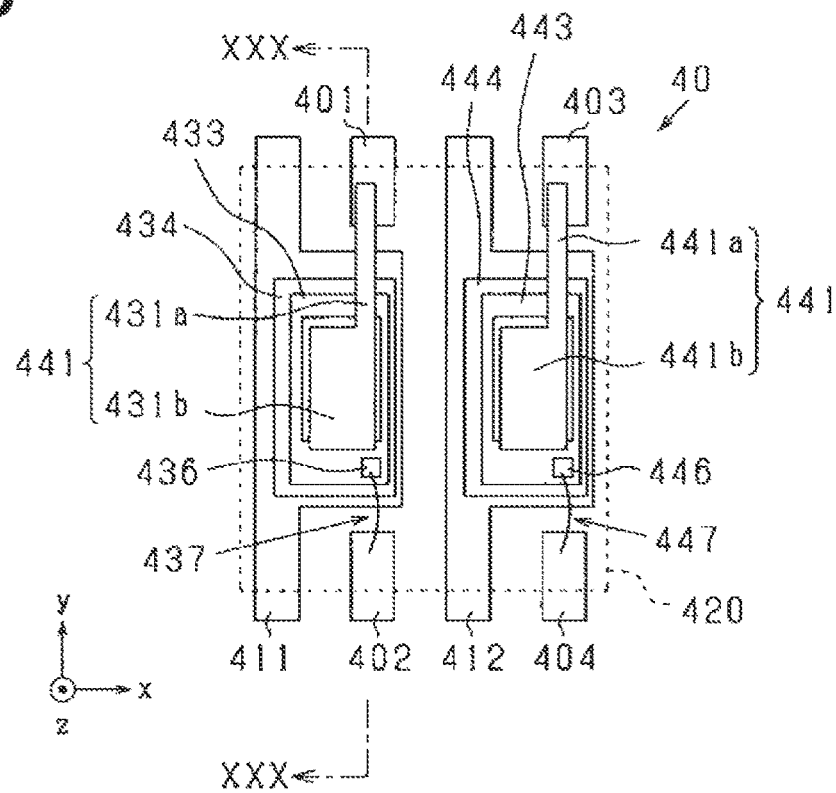
FIG. 29 is a plan view showing a state in which the resin mold is removed in the semiconductor module shown in FIG. 28.
Figure 30:
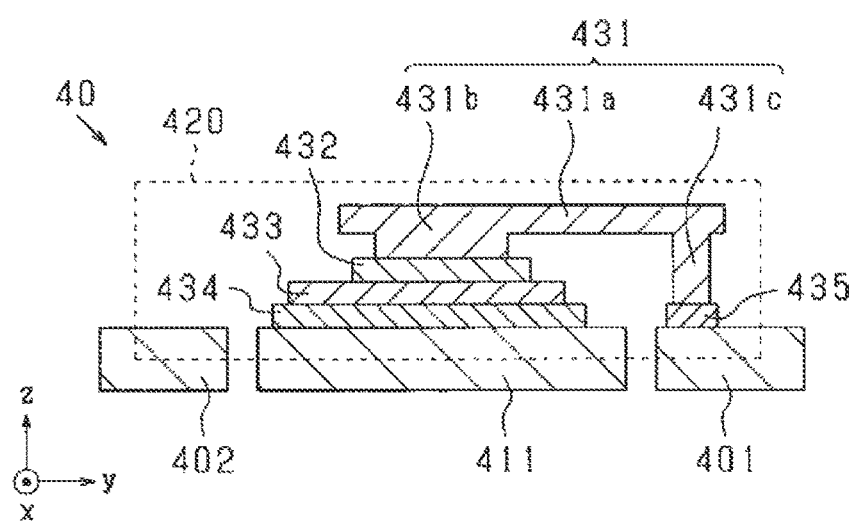
FIG. 30 is a cross-sectional view taken along a line XXX-XXX of FIG. 29.

In the semiconductor module 40 according to the fourth embodiment, as shown in FIGS. 28 to 30, the first semiconductor element 433 and the second semiconductor element 443 are integrally sealed in a state where they are arranged side by side in the x direction in the resin mold 420 in the same direction. The first semiconductor element 433 and the second semiconductor element 443 are arranged substantially in parallel with the adjacent semiconductor element in the same direction as the adjacent semiconductor element. As in the first embodiment, the first semiconductor element 433 and the second semiconductor element 443 are semiconductor elements having the same structure, shape, size, and the like. The first semiconductor element 433 and the second semiconductor element 443 are arranged so that the longitudinal direction when viewed from above is parallel to the x-axis.

Figure 31:
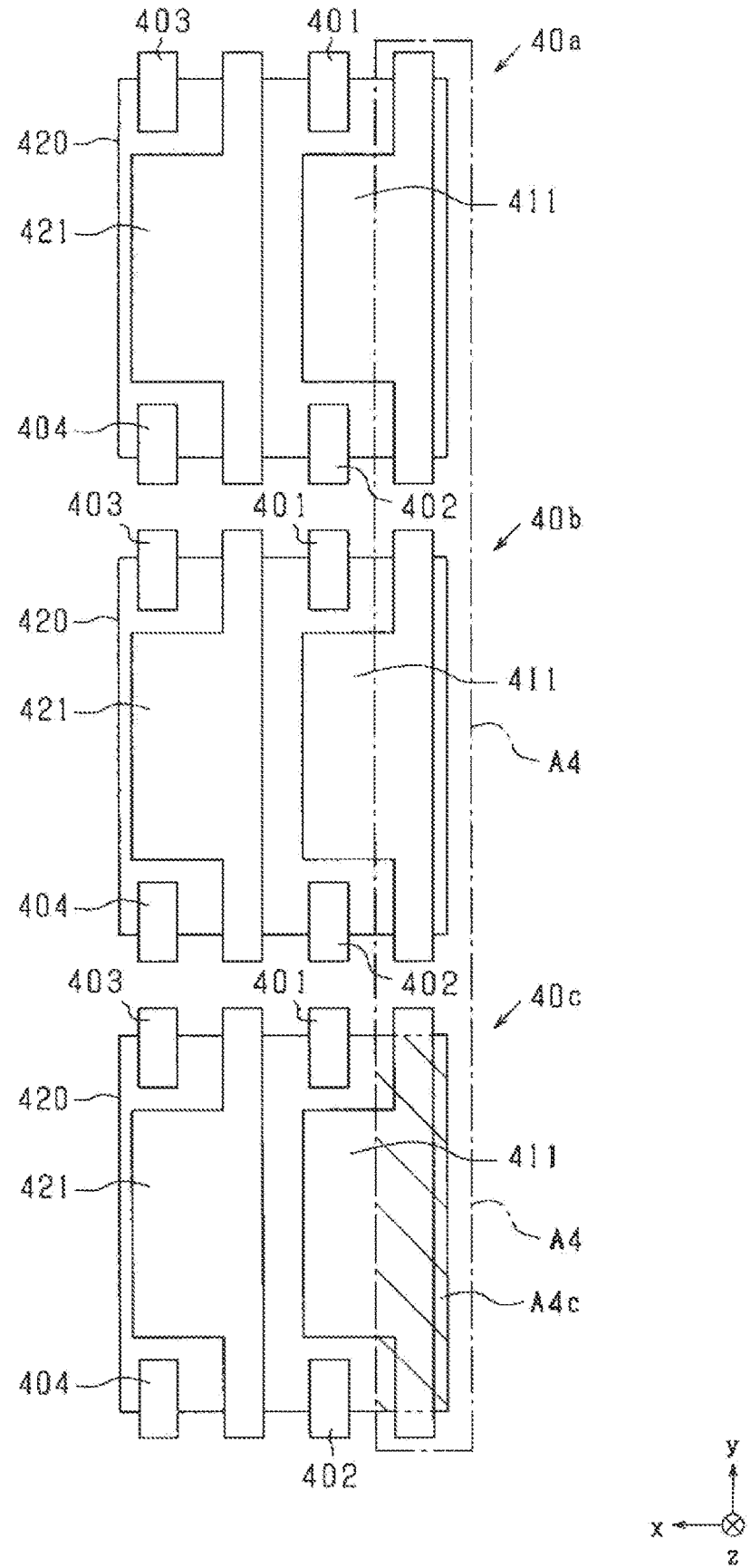
FIG. 31 is a diagram in which a plurality of semiconductor modules shown in FIG. 28 are arranged side by side.

As shown in FIGS. 29 to 31, on the first semiconductor element 433 side, the conductive member 431, the bonding member 432, the second semiconductor element 433, the bonding member 434, and the conductive member 411 are arranged in this order from above, similar to the first embodiment. The conductive member 431 includes a beam-shaped portion 431a, a pad portion 431b, and a columnar portion 431c. The beam-shaped portion 431a extends in the positive direction of the y-axis along the long side of the upper surface of the substantially rectangular shape of the pad portion 431b, and extends above the conductive member 412. The columnar portion 431c extends downward from the beam-shaped portion 431a, and its lower end surface is bonded to the upper surface of the conductive member 401 via a bonding member (not shown). The conductive member 402 is electrically connected to the gate pad 446 by the gate wiring 447.

On the second semiconductor element 443 side, the conductive member 441, the bonding member 442, the second semiconductor element 443, the bonding member 444, and the conductive member 412 are arranged in this order from above. The conductive member 441 includes a beam-shaped portion 441a, a pad portion 441b, and a columnar portion 441c. The beam-shaped portion 441a extends in the positive direction of the y-axis along the long side of the upper surface of the substantially rectangular shape of the pad portion 441b, and extends above the conductive member 403. The columnar portion 441c extends downward from the beam-shaped portion 441a, and its lower end surface is bonded to the upper surface of the conductive member 403 via a bonding member (not shown). The conductive member 404 is electrically connected to the gate pad 446 by the gate wiring 447. Each configuration on the second semiconductor element 443 side is a state in which each configuration on the first semiconductor element 433 side is moved in the positive direction of the x-axis, and each configuration has the same shape, size, and positional relationship.

The conductive members 401 and 402 correspond to the source terminal and the gate terminal of the first semiconductor element 433, and the conductive member 411 corresponds to the drain pad of the first semiconductor element 433. The conductive members 403 and 404 correspond to the source terminal and the gate terminal of the second semiconductor element 443, and the conductive member 412 corresponds to the drain pad of the second semiconductor element 443.

The conductive member 411 has a substantially T-shape, and includes a first terminal portion 411a, an element mounting portion 411b, an intermediate portion 411c, and a second terminal portion 411d. The element mounting portion 411b is provided substantially in the center of the conductive member 411 in the y direction, and the intermediate portion 411c is located on the negative direction side of the x-axis with respect to the element mounting portion 411b. The first terminal portion 411a is provided on the positive direction side of the y-axis and extends beyond the end portion of the resin mold 420 on the positive direction side of the y-axis. The second terminal portion 411d is provided on the negative direction side of the y-axis and extends beyond the end portion of the resin mold 420 on the negative direction side of the y-axis. The intermediate portion 411c is a portion between the first terminal portion 411a and the second terminal portion 411d. The first semiconductor element 433 is arranged in the element mounting portion 411b. Since the shape of the conductive member 412 is the same as that of the conductive member 411, the description thereof will be omitted by replacing 411 in the reference number with 412.

As shown in FIGS. 28 to 31, in the resin mold 420 having a substantially rectangular shape when the semiconductor module 40 is viewed from the bottom, there is a region in which only the conductive member 411 is included between the short sides facing in the y direction. This area corresponds to the common wiring area. Therefore, as shown in FIG. 31, when the three semiconductor modules 40 are arranged side by side in the same direction along the y direction so as to be substantially orthogonal to the short sides opposing the y direction, the region A4 extending straight along the y direction in a strip shape is secured. In FIG. 31, reference numbers of 40a, 40b, and 40c are assigned in order from the positive direction side of the y-axis at the arrangement positions. The region A4c shown in FIG. 31 indicates a common wiring region A4c of the semiconductor module 40c. The common wiring region A4c is a strip-shaped region that extends substantially straight from one opposite side to the other on the surface of the resin mold 420 on which the conductive member 411 is exposed. The conductive member 411 exists in the common wiring region A4c, and no conductive member other than the conductive member 411 exists. Although not shown, the semiconductor modules 40a and 40b also have the same common wiring area as the common wiring area A4c.

The region A4 is included in an area including the common wiring region of the semiconductor modules 40a to 40c and an area connecting between them. This region A4 extends over three semiconductor modules 40a, 40b, and 40c, and in the region A4, only the conductive member 411 is exposed from the resin mold 420. Therefore, by installing the common wiring connected to the three conductive members 411 respectively included in the three semiconductor modules 40a, 40b, and 40c in the region A4, the three conductive members 411 are electrically connected to each other. As is clear from FIG. 31, in the conductive member 412 as well, in the resin mold 420 which has a substantially rectangular shape when the semiconductor module 40 is viewed from the bottom, a region that includes only the conductive member 412 is disposed between the short sides facing in the y direction. Therefore, the common wiring connected to the three conductive members 412 included in the three semiconductor modules 40a, 40b, and 40c can be arranged.

Of the above conductive members, the conductive members 401 to 404, 411, 412 are exposed from the resin mold 420 on the upper surface side or the lower surface side of the semiconductor module 40. Of the conductive members 401 to 404, 411, 412, the conductive members 411, and 412 correspond to the common wiring electrode, and the conductive members 401 to 404 correspond to the non-common wiring electrode.

As described with reference to FIG. 31, by arranging the common wiring across the region A4, the common wiring is disposed from one side facing the x-axis direction to the other side on the lower surface of the resin mold 420 without not being electrically connected to the non-common wiring electrode (i.e., the conductive members 401 to 404, and the like). The wiring width of the common wiring (i.e., the width in the x direction orthogonal to the y direction, which is the wiring direction) is wider than the wiring width (i.e., the width in the x direction) of the conductive members 401 to 404, and the width of the region A4 in the x direction is secured sufficiently to arrange the common wiring.

That is, similarly to the semiconductor modules 10, 20, 30, in the semiconductor module 40, when the common wiring is connected to the common wiring electrode, each configuration (i.e., a plurality of semiconductor elements, a plurality of conductive members, and the like) constituting the semiconductor module 40 is arranged so that the common wiring electrode is exposed without being electrically connected to the non-common wiring electrode, and the common wiring can be arranged from one side to the other side opposite to the one side on the surface of the resin mold on which the common wiring electrode is exposed. Therefore, the plurality of semiconductor modules 40 can be electrically connected to each other on the lower surface side of the semiconductor module 40. As a result, the wiring space on the side of the semiconductor module 40 can be reduced, which can contribute to the downsizing of the mounting board. Further, in order to connect a plurality of semiconductor elements, it is possible to omit the wiring taken out to the side of the semiconductor element. As a result, the wiring area is reduced, the wiring resistance is reduced, and heat generation due to wiring can be suppressed. Furthermore, since the resin mold 420 is made of a high heat radiation resin material, heat radiation of the semiconductor module 40 can be promoted via the resin mold 420.

Further, in the semiconductor module 40, the common wiring electrode extends to a position where it protrudes from both of the opposite pair of sides of the surface of the resin mold. With this configuration, the common wiring can be realized without providing a step in the thickness direction of the conductive member. Further, in the semiconductor module 40, since it is not necessary to separately form the conductive member on the first semiconductor element side and the conductive member on the second semiconductor element side, the configuration is simple and it can contribute to the reduction of manufacturing cost and the like.

Fifth Embodiment

In each of the above embodiments, a semiconductor module including two semiconductor elements has been described as an example, but the semiconductor module may include three or more semiconductor elements.

Figure 32:
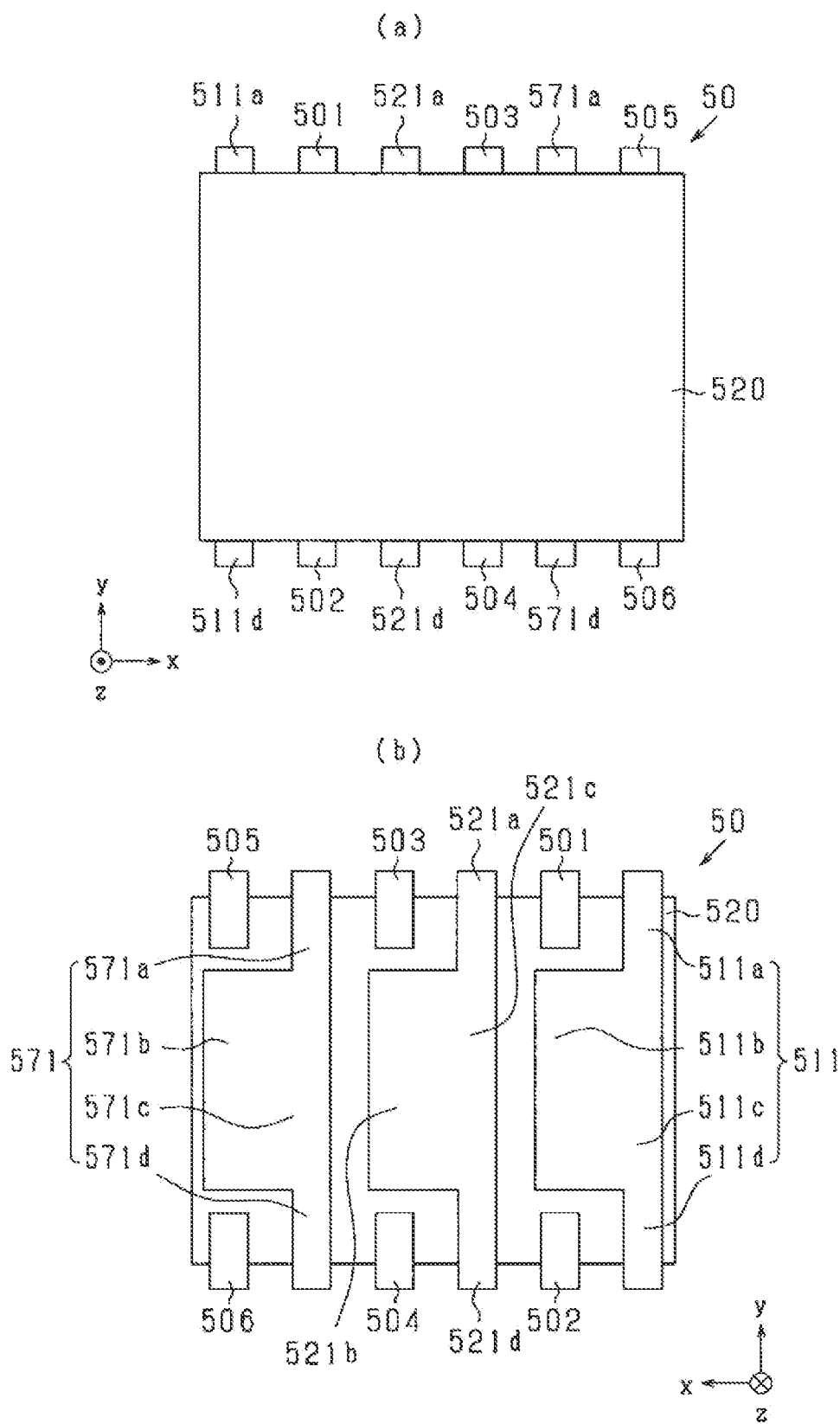
FIG. 32 is a plan view showing a semiconductor module according to a fifth embodiment.
Figure 33:
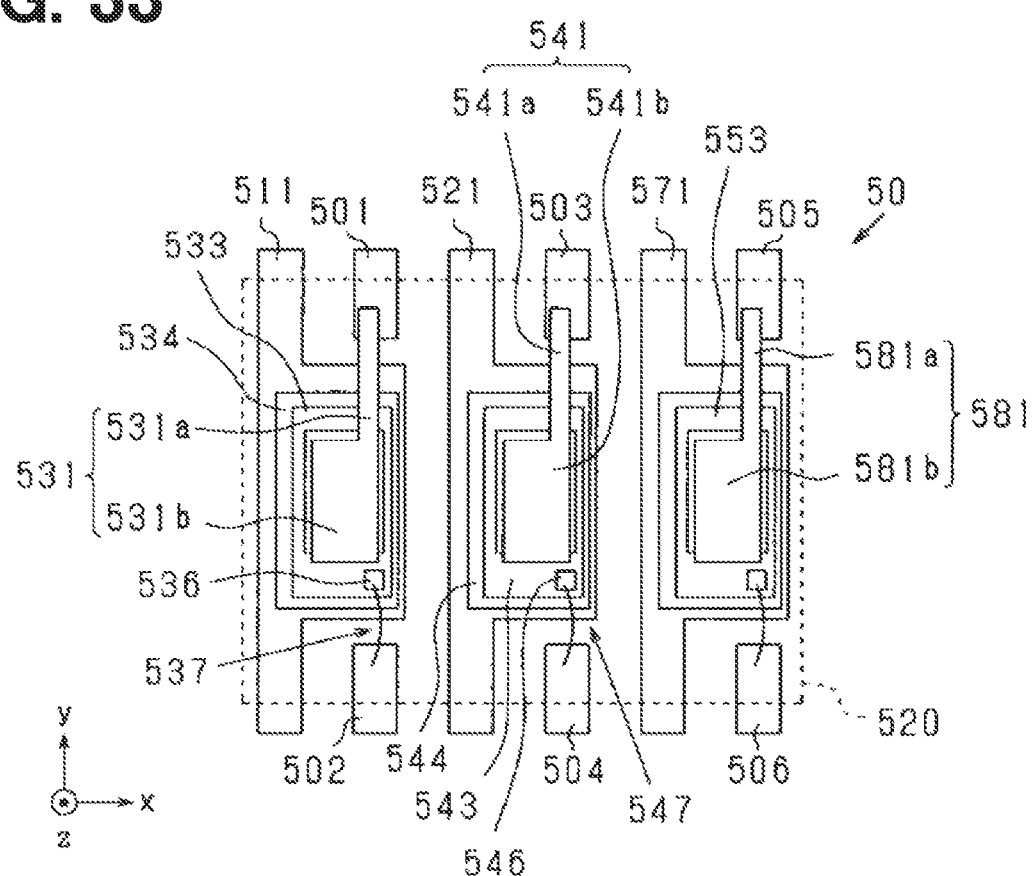
FIG. 33 is a plan view showing a state in which the resin mold is removed in the semiconductor module shown in FIG. 32.

In the semiconductor module 50 according to the fifth embodiment, as shown in FIGS. 32 to 33, the first semiconductor element 533 and the second semiconductor element 543 and the this semiconductor element 553 are integrally sealed in a state where they are arranged side by side in the x direction in the resin mold 520 in the same direction.

The semiconductor module 50 has a configuration in which a third semiconductor element 553 and a conductive member mounted or connected to the third semiconductor element 553 are further added to the semiconductor module 40. Since each configuration on the first semiconductor element 533 side and each configuration on the second semiconductor element 543 side are the same as each configuration on the first semiconductor element 433 side and each configuration on the second semiconductor element 443 side in the semiconductor module 40, the description will be omitted by replacing the reference number in the 400 series with the 500 series.

Each configuration on the third semiconductor element 553 side is a state in which each configuration on the first semiconductor element 533 side or each configuration on the second semiconductor element 543 side is moved in the positive direction of the x-axis, and each configuration has the same shape, size, and positional relationship.

On the third semiconductor element 553 side, the conductive member 581, the bonding member, the third semiconductor element 553, the bonding member, and the conductive member 571 are arranged in this order from above. The conductive member 581 includes a beam-shaped portion 581a, a pad portion 581b, and a columnar portion (not shown). The beam-shaped portion 581a extends in the positive direction of the y-axis along the long side of the upper surface of the substantially rectangular shape of the pad portion 581b, and extends above the conductive member 505. The columnar portion extends downward from the beam-shaped portion 581a, and its lower end surface is bonded to the upper surface of the conductive member 505 via a bonding member (not shown). The conductive member 506 is electrically connected to the gate pad by the gate wiring.

The conductive members 501 and 502 correspond to the source terminal and the gate terminal of the first semiconductor element 533, and the conductive member 511 corresponds to the drain pad of the first semiconductor element 533. The conductive members 503 and 504 correspond to the source terminal and the gate terminal of the second semiconductor element 543, and the conductive member 512 corresponds to the drain pad of the second semiconductor element 543. The conductive members 505 and 506 correspond to the source terminal and the gate terminal of the third semiconductor element 553, and the conductive member 571 corresponds to the drain pad of the third semiconductor element 553.

Figure 34:
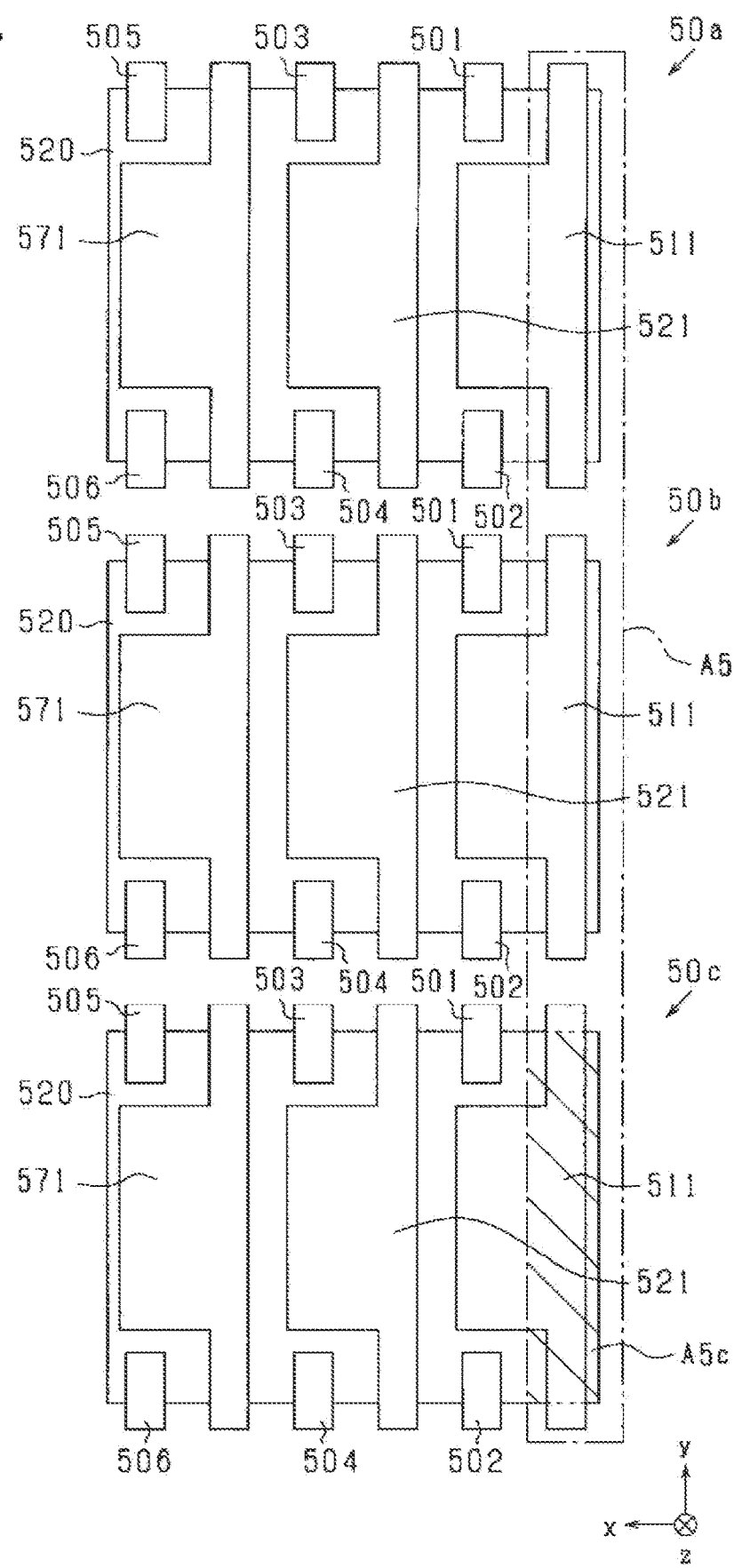
FIG. 34 is a diagram in which a plurality of semiconductor modules shown in FIG. 32 are arranged side by side.

As shown in FIGS. 32 to 34, in the resin mold 520 having a substantially rectangular shape when the semiconductor module 50 is viewed from the bottom, there is a region in which only the conductive member 511 is included between the short sides facing in the y direction. This area corresponds to the common wiring area. Therefore, as shown in FIG. 34, when the three semiconductor modules 50 are arranged side by side in the same direction along the y direction so as to be substantially orthogonal to the short sides opposing the y direction, the region A5 extending straight along the y direction in a strip shape is secured. In FIG. 34, reference numbers of 50a, 50b, and 50c are assigned in order from the positive direction side of the y-axis at the arrangement positions. The region A5c shown in FIG. 34 indicates a common wiring region A5c of the semiconductor module 50c. The common wiring region A5c is a strip-shaped region that extends substantially straight from one opposite side to the other on the surface of the resin mold 520 on which the conductive member 511 is exposed. The conductive member 511 exists in the common wiring region A5c, and no conductive member other than the conductive member 511 exists. Although not shown, the semiconductor modules 50a and 50b also have the same common wiring area as the common wiring area A5c.

The region A5 is included in an area including the common wiring region of the semiconductor modules 50a to 50c and an area connecting between them. This region A5 extends over three semiconductor modules 50a, 50b, and 50c, and in the region A5, only the conductive member 511 is exposed from the resin mold 520. Therefore, by installing the common wiring connected to the three conductive members 511 respectively included in the three semiconductor modules 50a, 50b, and 50c in the region A5, the three conductive members 511 are electrically connected to each other.

As is clear from FIG. 34, in the conductive members 512, 571 as well, in the resin mold 520 which has a substantially rectangular shape when the semiconductor module 50 is viewed from the bottom, a region that includes only the conductive member 512 is disposed between the short sides facing in the y direction. Therefore, it is possible to install the three conductive members 512 included in the three semiconductor modules 50a, 50b, and 50c, or the common wiring connected to the three conductive members 571, respectively. The wiring width of the common wiring (i.e., the width in the x direction orthogonal to the y direction, which is the wiring direction) is wider than the wiring width (i.e., the width in the x direction) of the conductive members 501 to 506, and the width of the region A5 in the x direction is secured sufficiently to arrange the common wiring.

Figure 35:
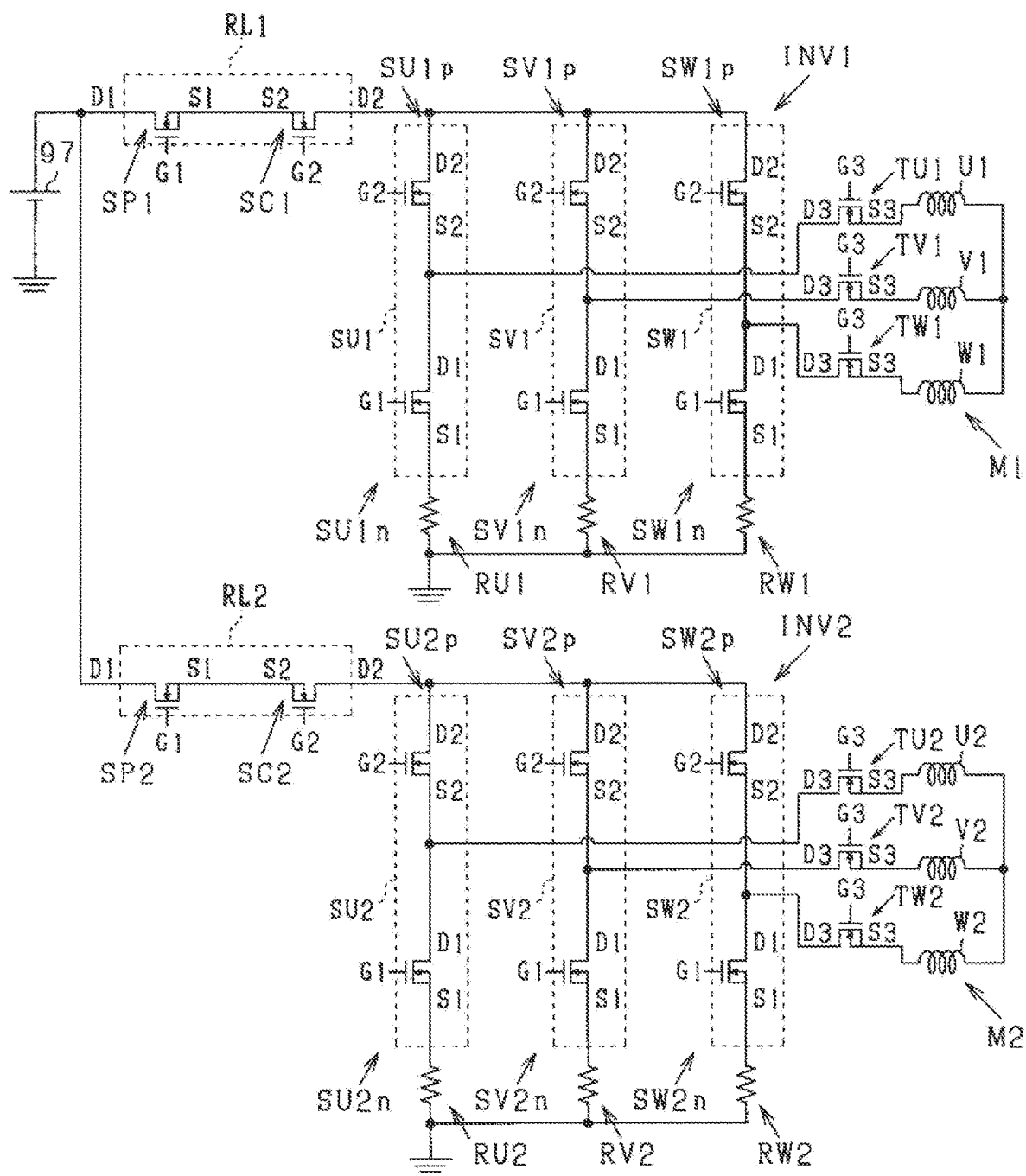
FIG. 35 is a diagram showing a drive circuit of an electric power steering system to which the semiconductor module shown in FIG. 32 is applied.

The semiconductor module according to this embodiment can be used in a drive circuit as shown in FIG. 35. The drive circuit shown in FIG. 35 corresponds to the drive circuit shown in FIG. 8 with adding the motor relay switches TU1, TV1, TW1, TU2, TV2, and TW2 therein. The connection point between the upper arm switch SU1p and the lower arm switch SU1n of the first U phase and the second end of the first U phase winding U1 are connected via the motor relay switch TU1. The connection point between the upper arm switch SV1p and the lower arm switch SV1n of the first V phase and the second end of the first V phase winding V1 are connected via the motor relay switch TV1. The connection point between the upper arm switch SW1p and the lower arm switch SW1n of the first W phase and the second end of the first W phase winding U1 are connected via the motor relay switch TW1. The connection point between the upper arm switch SU2p and the lower arm switch SU2n of the second U phase and the second end of the second U phase winding U2 are connected via the motor relay switch TU2. The connection point between the upper arm switch SV2p and the lower arm switch SV2n of the second V phase and the second end of the second V phase winding V2 are connected via the motor relay switch TV2. The connection point between the upper arm switch SW2p and the lower arm switch SW2n of the second W phase and the second end of the second W phase winding U2 are connected via the motor relay switch TW2.

The semiconductor module 50 can be applied to the EPS 80, and can be applied to the energization circuit unit 83 corresponding to a drive circuit of the EPS 80 as the semiconductor modules SU1 to SW2 including two switches connected in series with each other and the motor relay switch. Further, it may be configured as a semiconductor module in which SU1, SV1 and SW1 shown in FIG. 8 are integrated.

The semiconductor module having the low step portion 112a and the high step portion 112b in the conductive member 112 corresponding to the non-common wiring electrode described in the first embodiment also includes three or more semiconductor elements, and the common wiring can be enabled. For example, a semiconductor module 10 can provide the semiconductor module including three semiconductor elements capable of the common wiring by adding each configuration on the second semiconductor element 143 side to the semiconductor module 10 on the positive direction side of the x-axis.

Sixth Embodiment

In each of the above embodiments, a semiconductor module in which a conductive member that functions as a gate terminal or the like protrudes laterally from the resin mold when viewed from above has been described as an example, and it may not be limited to this feature. The conductive member may not protrude to the side of the semiconductor module.

As shown in FIGS. 36 to 39, a semiconductor module 160 according to a first embodiment includes a first semiconductor element 633 and a second semiconductor element 643, a resin mold 620 for integrally sealing the first semiconductor element 633 and the second semiconductor element 643, conductive members 601-605, and conductive members 611, 612, 631, 641. An x-axis direction and a y-axis direction shown in FIGS. 36 to 39 are sides of the semiconductor module 160, and an xy-plane direction is a plane direction of the semiconductor module 160. The z-axis direction is a vertical direction orthogonal to the plane direction.

Figure 36:
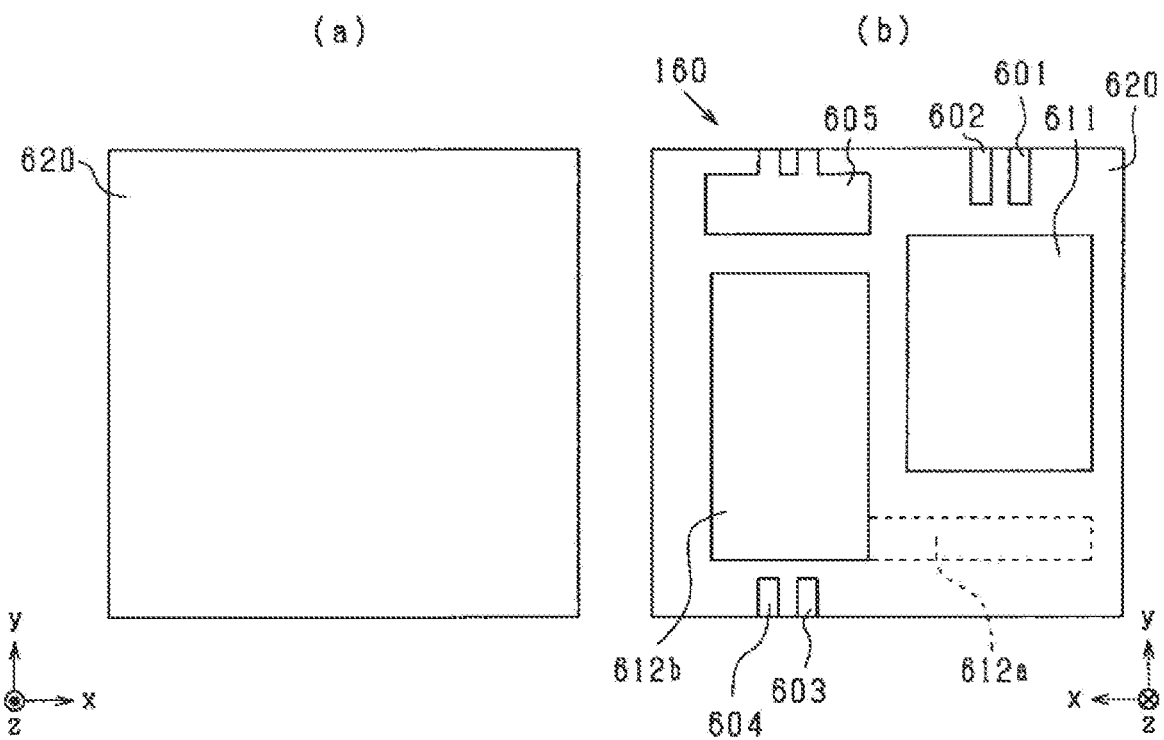
FIG. 36 is a plan view showing a semiconductor module according to a sixth embodiment.
Figure 37:
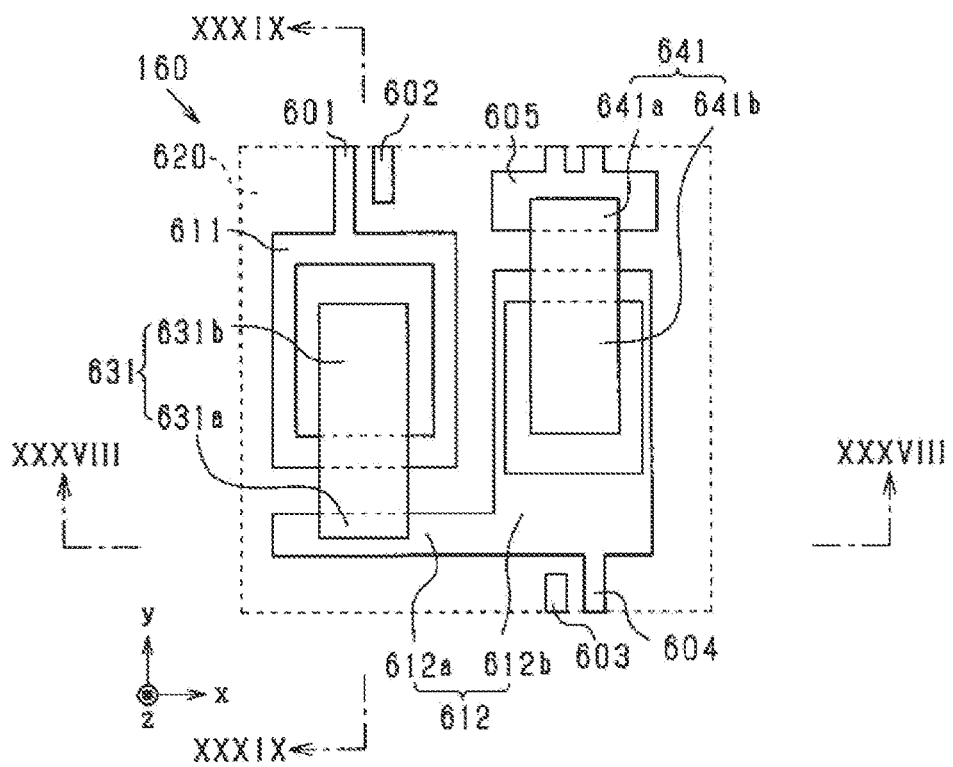
FIG. 37 is a plan view showing a state in which the resin mold is removed in the semiconductor module shown in FIG. 36.
Figure 38:
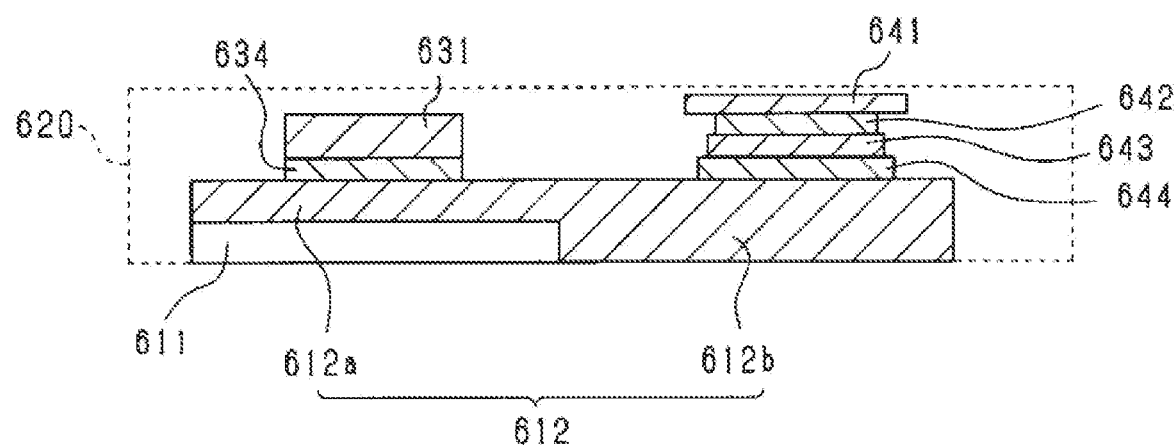
FIG. 38 is a cross-sectional view taken along a line XXXVIII-XXXVIII of FIG. 37.
Figure 39:
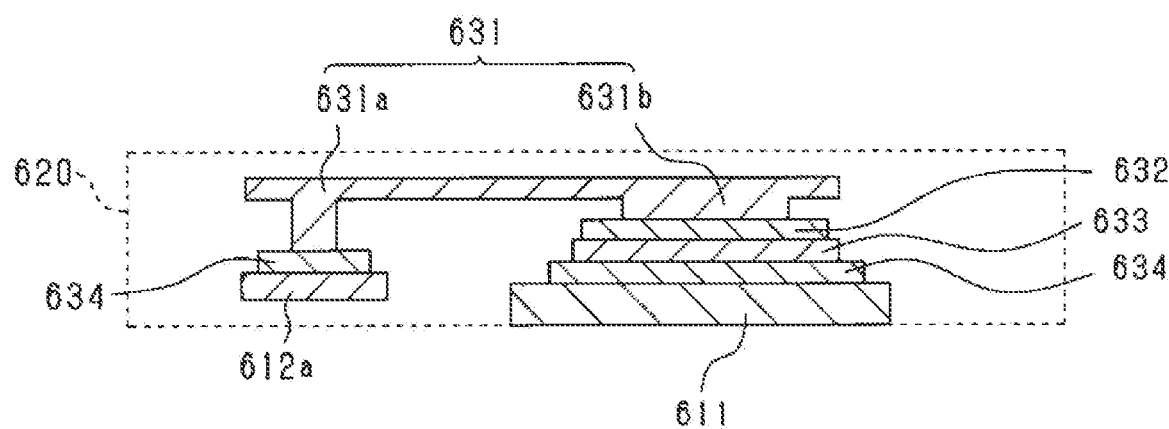
FIG. 39 is a cross-sectional view taken along line XXXIX-XXXIX of FIG. 37.

(a) of FIG. 36 is a top view of the semiconductor module 160, and (b) of FIG. 36 is a bottom view of the semiconductor module 160. FIG. 37 is a top view of each configuration in the resin mold 120 of the semiconductor module 160, and FIGS. 38 and 39 are cross-sectional views of each configuration in the resin mold 120 of the semiconductor module 160. In FIGS. 37 to 39, the position where the resin mold 120 is provided is shown by a broken line.

As shown in FIGS. 36 to 39, in the resin mold 620, the second semiconductor element 643 is integrally sealed while being arranged side by side in the x direction along a direction rotated by 180 degrees with respect to the first semiconductor element 633 around the vertical direction (i.e., the z direction). The first semiconductor element 633 and the second semiconductor element 643 are semiconductor elements having the same structure, shape, size, and the like, and have a substantially rectangular shape when viewed from the top.

On the first semiconductor element 633 side, the conductive member 631, the bonding member 632, the first semiconductor element 633, the bonding member 634, and the conductive member 611 are arranged in this order from above. On the second semiconductor element 643 side, the conductive member 641, the bonding member 642, the second semiconductor element 643, the bonding member 644, and the conductive member 612 are arranged in this order from above.

When the semiconductor module 160 is viewed from the lower surface, the entire lower surfaces of the conductive members 601 to 605 and the conductive member 111 are exposed from the resin mold 620.

In the semiconductor module 160, as shown in (b) of FIG. 36, the conductive members 601 to 605 that function as the gate terminal, the source terminal, or the drain terminal are exposed on the lower surface side (i.e., the negative direction of the z-axis) of the resin mold 620, and do not protrude in the lateral y direction.

The conductive member 612 includes a low step portion 612a that is not exposed from the resin mold 620 and a high step portion 612b that is exposed from the resin mold 620. The high step portion 612b is a substantially rectangular portion arranged below and around the second semiconductor element 643. The low step portion 612a is an elongated rectangular portion extending from the end of the high step portion 612b to the side where the first semiconductor element 633 is arranged (i.e, the negative direction side of the x-axis).

The conductive member 631 has a substantially rectangular shape when viewed from above, and includes an extending portion 631a and a pad portion 631b. The pad portion 631b is located on the upper surface side of the first semiconductor element 633, and is bonded to the upper surface side (i.e., the source electrode side) of the first semiconductor element 633 via the bonding member 632. The extending portion 631a extends from the pad portion 631b in the negative direction of the y-axis and extends above the low step portion 612a of the conductive member 612. The lower end surface of the extending portion 631a is bonded to the upper surface of the low step portion 612a via the bonding member 634. The drain electrode side, which is the lower surface side of the second semiconductor element 643, and the source electrode side, which is the upper surface side of the first semiconductor element 633, are electrically connected via the conductive member 631 and the conductive member 612.

Like the conductive member 631, the conductive member 641 has a substantially rectangular shape when viewed from above, and includes an extending portion 641a and a pad portion 641b. The pad portion 641b is located on the upper surface side of the second semiconductor element 643, and is bonded to the upper surface side (i.e., the source electrode side) of the second semiconductor element 643 via the bonding member 642. The extending portion 641a extends from the pad portion 641b in the positive direction of the y-axis and extends above the conductive member 605. The lower end surface of the extending portion 641a is bonded to the upper surface of the conductive member 605 via the bonding member 644.

The conductive member 601 is connected to the conductive member 611 that functions as a drain pad of the first semiconductor element 633, and functions as a drain terminal of the first semiconductor element 633. The conductive member 602 is electrically connected to the gate electrode of the first semiconductor element 633 and functions as a gate terminal of the first semiconductor element 633. The conductive member 603 is electrically connected to the gate electrode of the second semiconductor element 643 and functions as a gate terminal of the second semiconductor element 643.

The conductive member 604 is connected to the conductive member 612 that functions as a drain pad of the second semiconductor element 643. Since the conductive member 612 is electrically connected to the drain electrode of the second semiconductor element 643 and the source electrode of the first semiconductor element 633, the conductive member 604 functions as a source terminal of the first semiconductor element 633 and a drain terminal of the second semiconductor element 643. The conductive member 605 is electrically connected to the conductive member 641 that functions as a source pad of the second semiconductor element 643, and functions as a drain terminal of the second semiconductor element 643.

As shown in FIGS. 36 to 39, a low step portion 612a is provided at a position facing the conductive members 601, 602 functioning as a gate terminal and a drain terminal in the y direction via the first semiconductor element 633. Then, on the lower surface side of the semiconductor module 160, the low step portion 612a is covered with the resin mold 620, so that there is a region where nothing is exposed on the surface of the resin mold 620. This area corresponds to the common wiring area.

Figure 40:
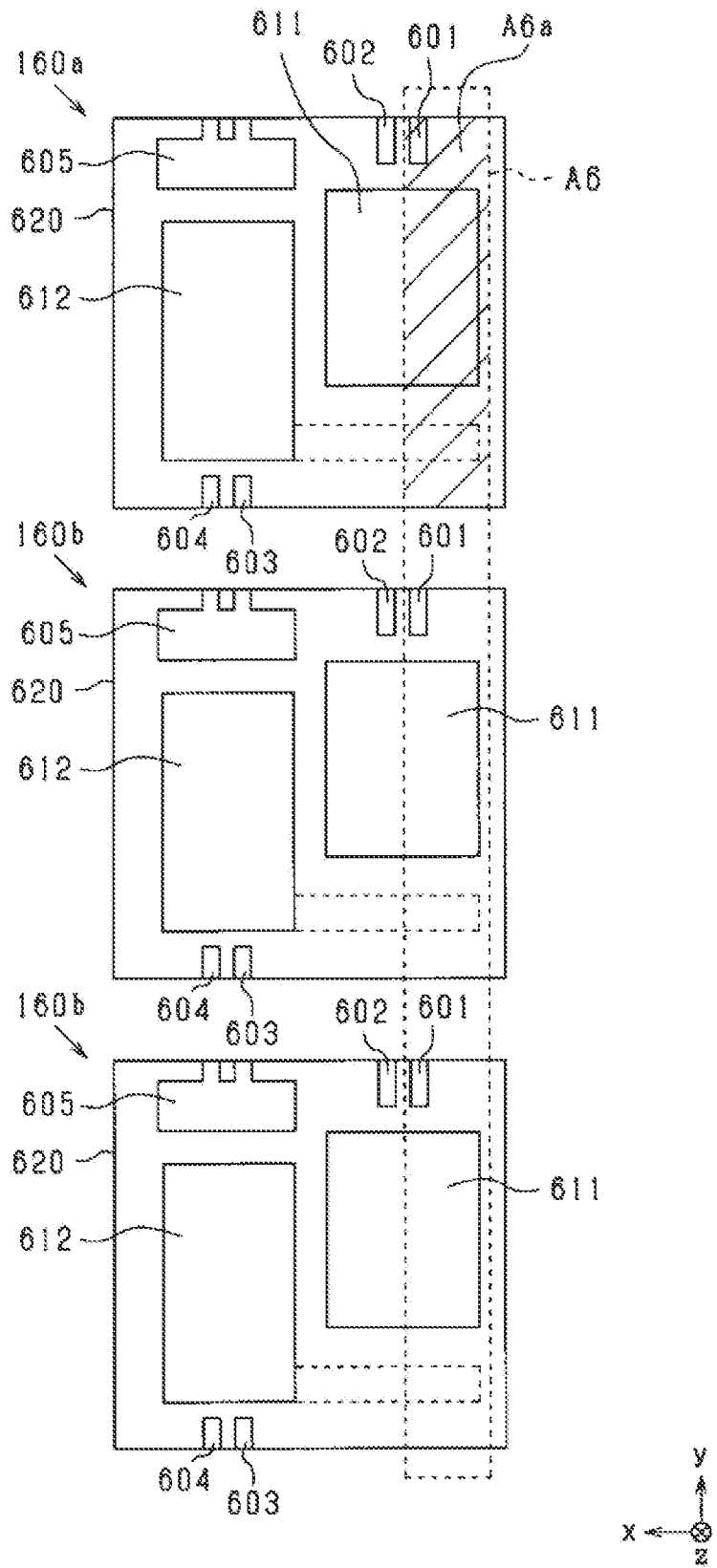
FIG. 40 is a diagram in which a plurality of semiconductor modules shown in FIG. 36 are arranged side by side.

Therefore, as shown in FIG. 40, when the three semiconductor modules 160 are arranged side by side in the same direction along the y direction so as to be substantially orthogonal to the long sides opposing the y direction, for example, the region A6 extending straight along the y direction in a strip shape is secured. The region A6 is a substantially rectangular region extending in the y direction on the negative side of the x-axis with respect to the conductive member 602. In FIG. 40, reference numbers of 160a, 160b, and 160c are assigned in order from the positive direction side of the y-axis at the arrangement positions. The area A6a indicates a common wiring area A6a of the semiconductor module 160a. The common wiring region A6c is a strip-shaped region that extends substantially straight from one opposite side to the other on the surface of the resin mold 620 on which the conductive member 611 is exposed. In the common wiring region A6a, the conductive member 611 exists, and no conductive member other than the conductive member 601 having the same potential as the conductive member 611 exists. Although not shown, the semiconductor modules 160b and 160c also have the same common wiring area as the common wiring area A6c.

The region A6 is included in an area including the common wiring region of the semiconductor modules 160a to 160c and an area connecting between them. This region A6 extends over three semiconductor modules 160a, 160b, 160c, and in the region A6, only the conductive member 611 and the conductive member 601 having the same potential as the conductive member 611 are exposed from the resin mold 620. Therefore, by installing the common wiring connected to the three conductive members 611 respectively included in the three semiconductor modules 160a, 160b, and 160c in the region A6, the three conductive members 611 are electrically connected to each other. The wiring width of the common wiring (i.e., the width in the x direction orthogonal to the y direction, which is the wiring direction) is wider than the wiring width (i.e., the width in the x direction) of the conductive members 601 to 603, and the width of the region A6 in the x direction is secured sufficiently to arrange the common wiring. The conductive member 611 corresponds to a common wiring electrode.

That is, in the semiconductor module 160, when the common wiring is connected to the common wiring electrode (i.e., the conductive member 611), each configuration (i.e., a plurality of semiconductor elements, a plurality of conductive members, and the like) constituting the semiconductor module 160 is arranged so that the common wiring is not electrically connected to the non-common wiring electrode (i.e., the conductive members 601 to 605, 612), and the common wiring is arranged from one side to the other opposite side on the surface of the resin mold on which the common wiring electrode is exposed. Therefore, similarly to the first embodiment and the like, the plurality of semiconductor modules 160 can be electrically connected to each other on the lower surface side of the semiconductor module 160. As a result, the wiring space on the side of the semiconductor module 160 can be reduced, which can contribute to the downsizing of the mounting board. Further, in order to connect a plurality of semiconductor elements, it is possible to omit the wiring taken out to the side of the semiconductor element. As a result, the wiring area is reduced, the wiring resistance is reduced, and heat generation due to wiring can be suppressed.

Figure 41:
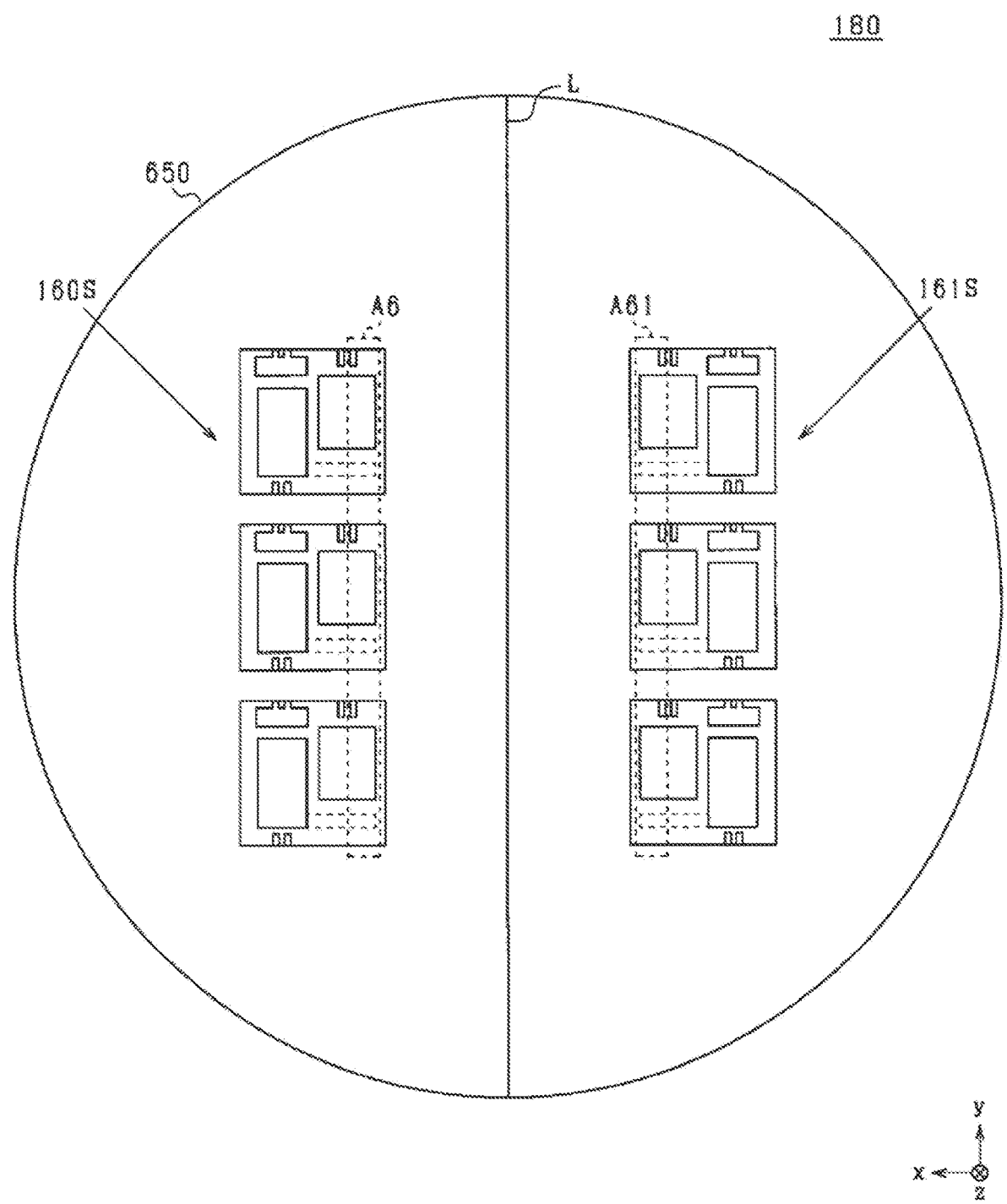
FIG. 41 is a diagram in which a set of semiconductor modules shown in FIG. 40 and another set of semiconductor modules are installed so as to be line-symmetrical on a wiring board.

FIG. 41 shows an electronic device 180 in which module sets 160s and 161s including three semiconductor modules are arranged on a wiring board 650, respectively. The module set 160s has three semiconductor modules 160 arranged in the state shown in FIG. 40. In the module set 161s, three semiconductor modules are arranged side by side in the y direction as in FIG. 40 so that the positional relationship of each configuration of the semiconductor module 160 is line-symmetrical with respect to the y-axis shown in FIGS. 36 to 39. As for the module set 161s, the region A61 as a common wiring region expanding over the three semiconductor modules can be secured as in the region A6. The module set 160s and the module set 161s are provided so as to be substantially line-symmetric with respect to the center line L1 extending along the y direction through the center of the wiring board 650. The module sets 160s and 161s are arranged so that the regions A6 and A61 are located closer to the center line L1. The electronic device 180 shown in FIG. 41 may be applied to, for example, the inverter circuit shown in FIG. 8. More specifically, for example, the module set 160s may be used as the first inverter INV1 and the module set 161s may be used as the second inverter INV2.

Figure 42:
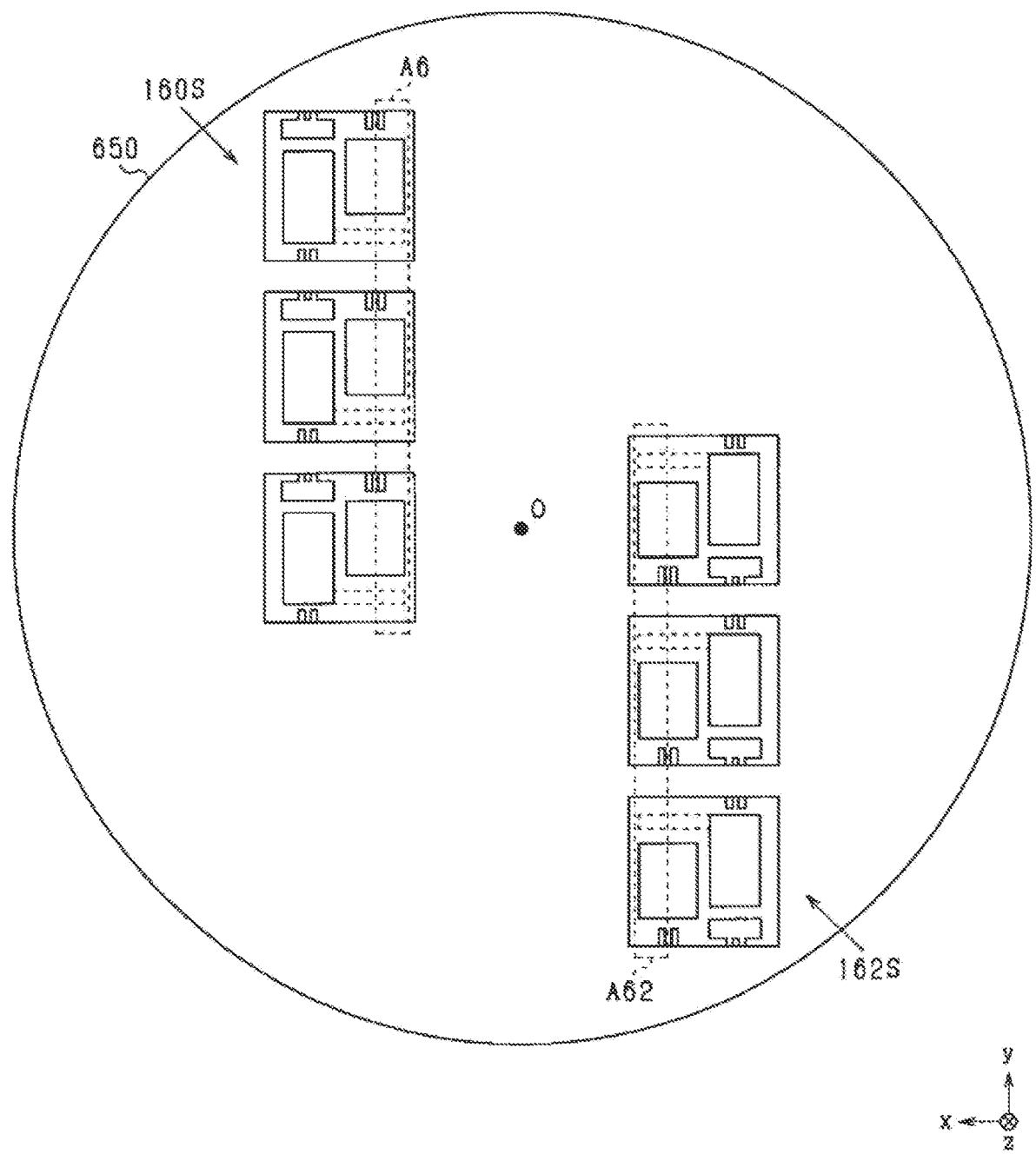
FIG. 42 is a diagram in which a set of semiconductor modules shown in FIG. 40 and another set of semiconductor modules are installed so as to be point-symmetrical on a wiring board.

FIG. 42 shows an electronic device 181 in which module sets 160s and 162s including three semiconductor modules are arranged on a wiring board 650, respectively. The module sets 160s, 162s have three semiconductor modules 160 arranged in the state shown in FIG. 40. The module set 160s and the module set 162s are provided so as to be substantially point-symmetrical with respect to the center O of the wiring board 650. The module set 162s is arranged at a position where the module set 160s is rotated by 180 degrees around the center O. The module sets 160s and 162s are arranged so that the regions A6 and A62 are located closer to the center O. The electronic device 181 shown in FIG. 42 may be applied to, for example, the inverter circuit shown in FIG. 8. More specifically, for example, the module set 160s may be used as the first inverter INV1 and the module set 161s may be used as the second inverter INV2.

Figure 43:
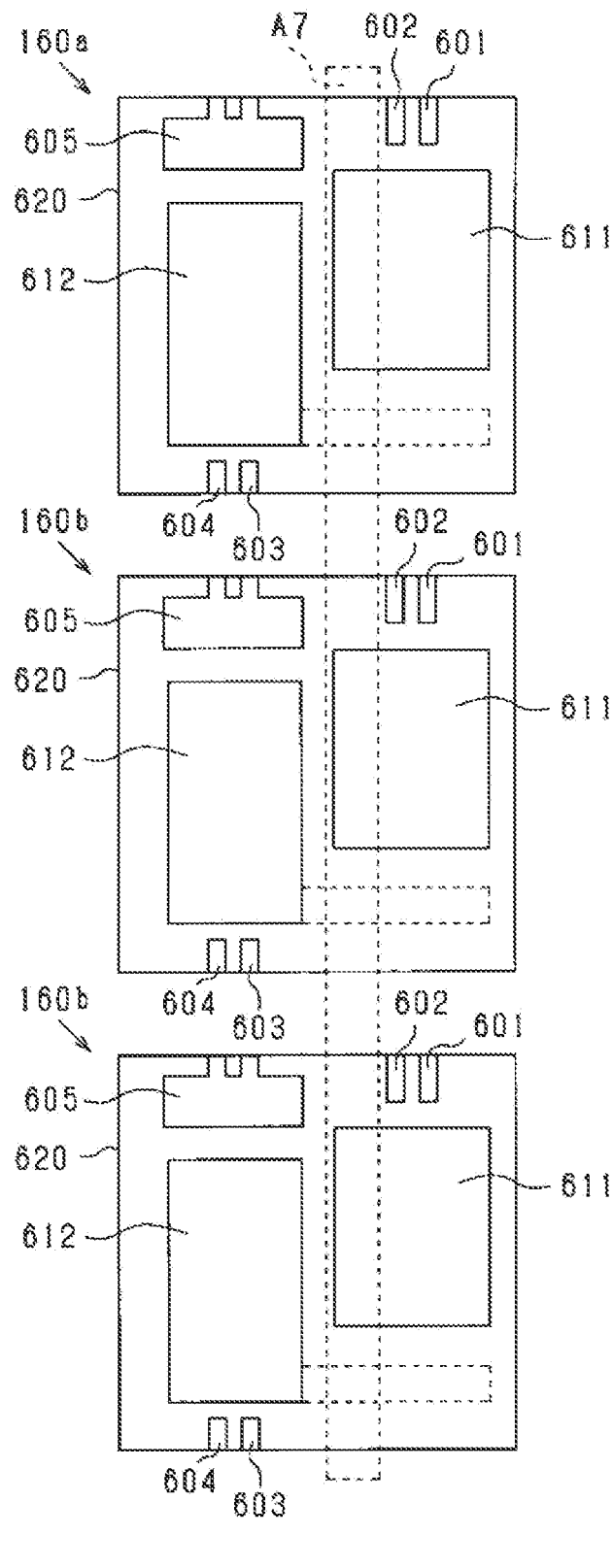
FIG. 43 is a diagram in which a plurality of semiconductor modules shown in FIG. 36 are arranged side by side.
Figure 44:
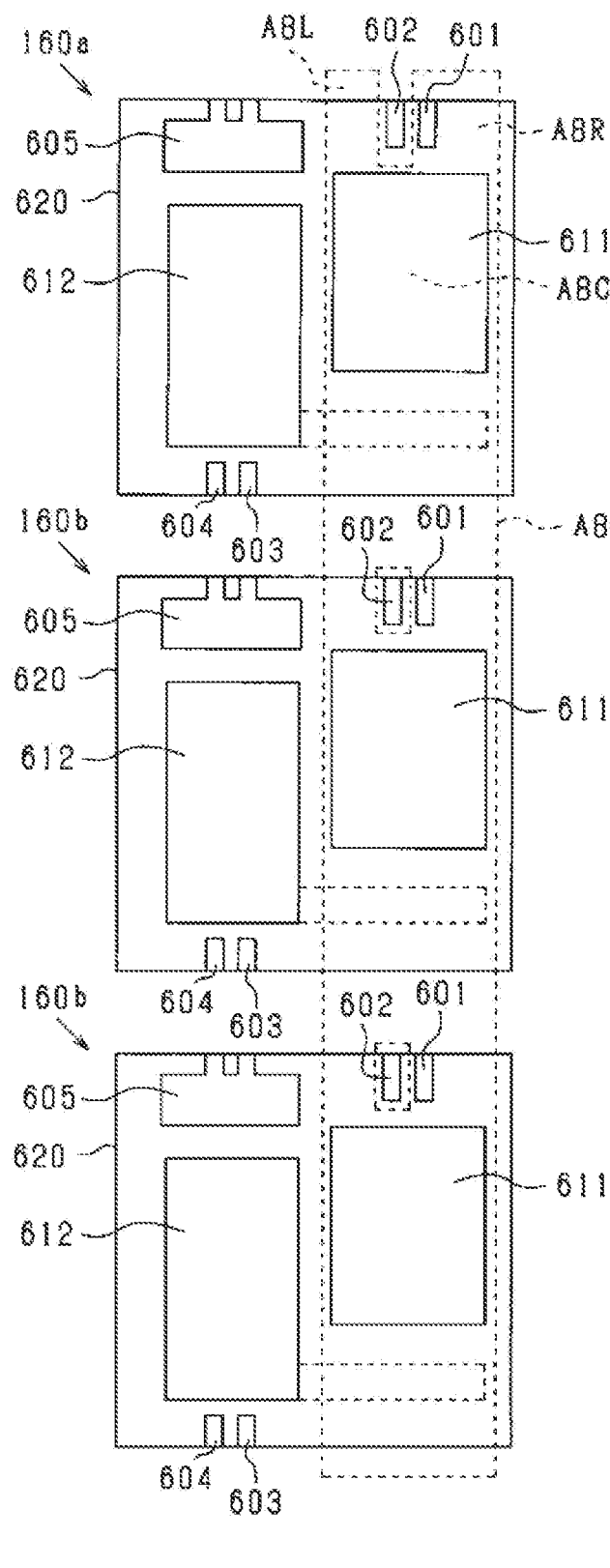
FIG. 44 is a diagram in which a plurality of semiconductor modules shown in FIG. 36 are arranged side by side.

When the semiconductor modules 160a to 160c are arranged as shown in FIG. 40, a common wiring region can be secured in a manner different from that of the region A6. For example, as shown in FIG. 43, a substantially rectangular region A7 extending in the y direction on the positive direction side of the x-axis with respect to the conductive member 602 can be secured as a common wiring region. Further, both the area A6 shown in FIG. 40 and the area A3 shown in FIG. 43 may be used as a common wiring area. Further, the area A8 as shown in FIG. 44 may be secured as a common wiring area. The region A8 is a region including a portion A8R at the same position as the region A6, a portion A8L at the same position as the region A7, and a portion A8R and a portion A8C. The portion A8C may be provided at a position not in contact with the conductive member 602. When the semiconductor modules 160a to 160c are connected using the common wiring similar to the shape of the region A8, the cross-sectional area in the current flow direction in the common wiring can be increased, and the wiring resistance can be reduced.

Figure 45:
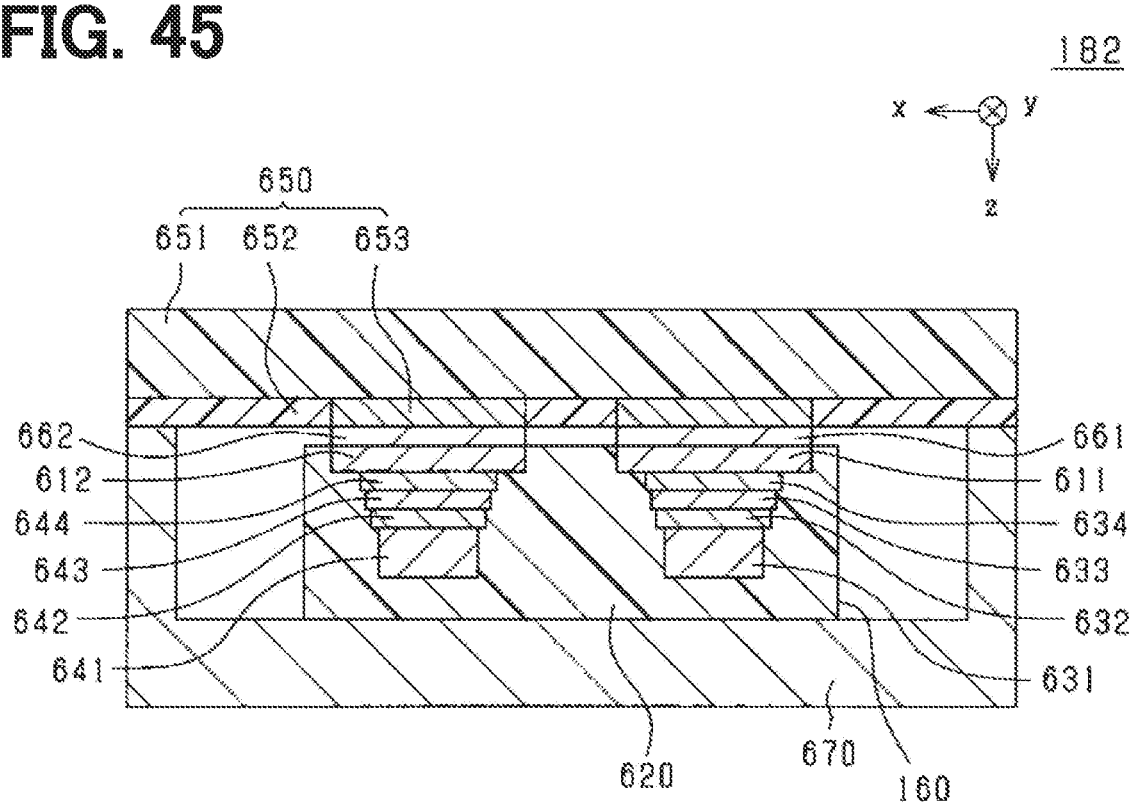
FIG. 45 is a diagram showing a mounting example of a semiconductor module according to a sixth embodiment.

FIG. 45 shows an electronic device 182 as an example of a state in which the semiconductor module 160 is mounted on the wiring board 650. The electronic device 182 includes a semiconductor module 160, a wiring board 650, and a housing 670. The semiconductor module 160 is arranged such that the module 160 is mounted on the wiring board 650 and is disposed in a housing 670 with an opening on an upper side (i.e., the negative direction side of the z-axis) shown in FIG. 45, and an upper surface side of the module 160 (i.e., the positive direction side of the z-axis) shown in FIG. 36 faces the lower side. The upper surface of the housing 670 is covered with a wiring board 650.

The wiring board 650 includes a base material portion 651, a wiring portion 652, and a resist portion 653 provided around the wiring portion 652. A wiring portion 652 and a resist portion 653 are provided on the surface of the base material portion 651 on the positive direction side of the z-axis, and a wiring pattern is formed. A bonding member 662 is provided in contact with the upper surface of the conductive wiring portion 652, and the semiconductor module 160 is bonded to the wiring board 650 via the bonding member 662. More specifically, the conductive members 611 and 612 are bonded to and fixed to the wiring portion 652 via the bonding member 662. The bonding member 662 is made of, for example, a solder material. The resist portion 653 is made of a resist resin material such as an epoxy resin. The housing 670 is made of a metal such as aluminum.

As shown in FIG. 45, the non-mounting surface of the semiconductor module 160 facing the wiring board 650 is a surface in the positive direction of the z-axis and is covered with a resin mold 620 made of a high heat radiation resin material, and the conductive member is not exposed thereon. The surface of the resin mold 620 facing the wiring board 650 is in contact with the housing 670. The depth of the housing 670 (i.e., the height in the z direction of the inner wall surface) substantially coincides with the total thickness (i.e., the length in the z direction) of the semiconductor module 160 and the bonding members 661 and 662.

Since the resin mold 620 is made of a high heat radiation resin material, heat generated by the semiconductor module 160 and the wiring board 650 can be discharged via the resin mold 620. Further, since the resin mold 620 is in contact with the housing 670, heat generated in the semiconductor module 160 and the wiring board 650 can be efficiently radiated to the housing 670 via the resin mold 620.

Figure 46:
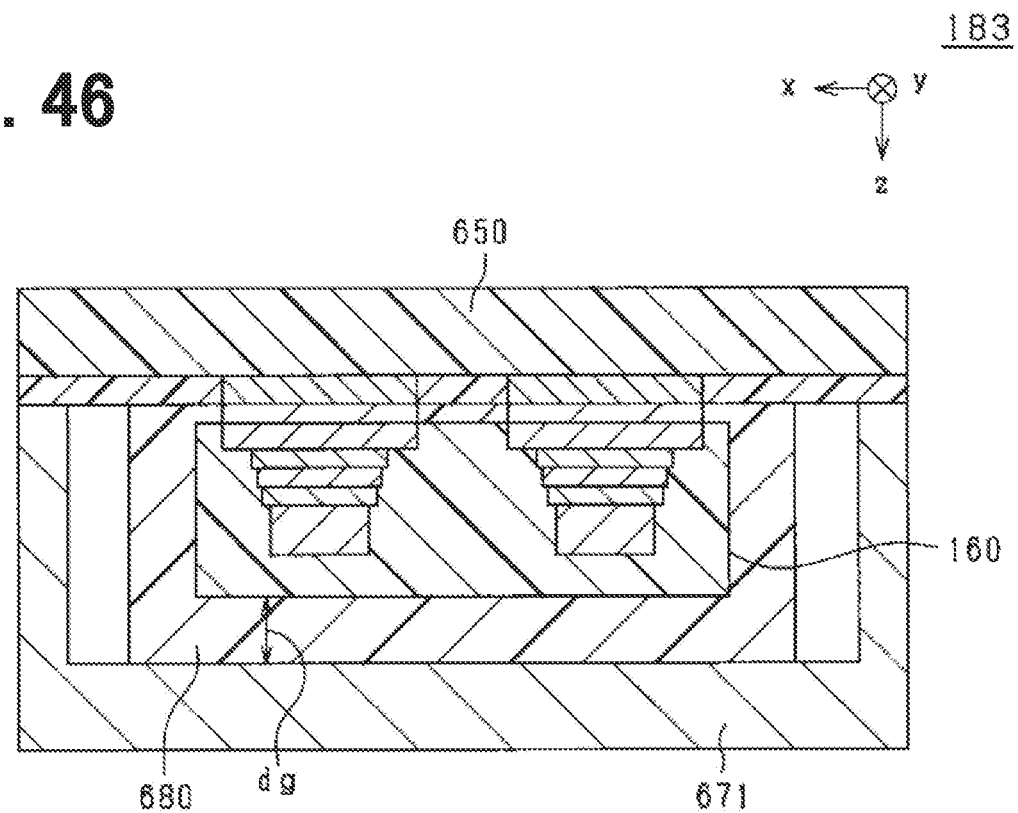
FIG. 46 is a diagram showing a mounting example of a semiconductor module according to a sixth embodiment.

FIG. 46 shows an electronic device 183 as another example of a state in which the semiconductor module 160 is mounted on the wiring board 650. Similar to FIG. 46, the semiconductor module 160 is arranged such that the module 160 is mounted on the wiring board 650 and is disposed in a housing 671 with an opening on an upper side (i.e., the negative direction side of the z-axis) shown in FIG. 46, and an upper surface side of the module 160 (i.e., the positive direction side of the z-axis) shown in FIG. 36 faces the lower side. The upper surface of the housing 671 is covered with a wiring board 650.

In FIG. 46, in the housing 671, the semiconductor module 160 is housed in the housing 671 in a state where the heat radiation member 680 covers the sides (in the x direction and the y direction) and the lower side (in the positive direction of the z axis). The housing 671 is configured in the same manner as the housing 670 except that the depth is different. The depth of the housing 671 is substantially the same as the total value obtained by adding the thickness dg of the heat radiation member 680 to the thickness of the semiconductor module 160 and the bonding members 661 and 662. it is possible to secure the heat radiation path to the housing 671 by adjusting the thickness dg of the heat radiation member 680 that fills the space between the housing 671 and the semiconductor module 160 even if the difference between the thickness of the semiconductor module 160 and the bonding members 661 and 662 and the depth of the housing 671 varies due to design tolerances.

The heat radiation member 680 is made of a gel-like material such as a resin material or a silicon material, or a high heat radiating material obtained by mixing an adhesive with a filler for improving heat radiating property. As the filler used for the high heat radiation material, for example, a composite oxide material having high thermal conductivity such as alumina is selected. By adjusting the type of filler and the filling rate, the thermal conductivity of the heat radiation member 680 can be adjusted.

It may be preferable that the heat radiation member 680 is adjusted to have a thermal conductivity equal to or higher than that of the resin mold 620. For example, when the thermal conductivity of the resin mold 620 is defined as km and the thermal conductivity of the heat radiation member 680 is defined as kg, it may be preferable that km≥2 W/(m·K), and km≥3 W/(m·K). Further, it is sufficient that kg km, and it may be preferable that kg>km. Conventionally, in a semiconductor module in which an electrode is exposed on the non-mounting surface, it may not be necessary to increase the thermal conductivity of the resin mold since the heat is radiated from the exposed electrode. Thus, the thermal conductivity may be as low as less than 1 W/(m·K). On the other hand, by using the resin mold 620 having a high thermal conductivity as in the present embodiment, even if the electrodes of the semiconductor module 160 are covered with the resin mold 620, the heat generated by the semiconductor module 160 and the like is radiated in the housings 670 and 671 efficiently. Further, by increasing the thermal conductivity km and kg to be higher than the thermal conductivity of the configuration on the wiring substrate 650 side (for example, the thermal conductivity of the resist portion 653), the efficiency is higher and the heat can be radiated to the housing 670, 671 side. The thermal conductivity of the housing 670, 671 made of aluminum is about 100 to 300 W/(m·K), which is remarkably high with respect to km, and kg.

Further, since the non-mounting surface of the semiconductor module 160 is covered with the resin mold 620 and the conductive member functioning as an electrode is not exposed, the thickness dg of the heat radiation member 680 can be reduced, compared with the semiconductor module in which the electrode is exposed on the non-mounting surface. The resin mold 620 has higher insulating properties than the heat radiation member 680, and the thickness required for ensuring insulation is small. Therefore, the distance between the lower surface of the electrode on the non-mounting surface side of the semiconductor module 160 (i.e., the conductive members 631, 641 in this embodiment) and the upper surface of the housing 671 can be shortened, compared with the semiconductor module in which the electrode is exposed on the non-mounting surface. As a result, according to the semiconductor module 160, the mounting portion can be made smaller than before.

In FIGS. 45 and 46, the mounting state of the semiconductor module 160 according to the sixth embodiment has been described. Alternatively, among the semiconductor modules described in each of the above embodiments, the semiconductor module (for example, semiconductor modules 10, 20, 30, 40, 50) in which the non-mounting surface is covered with the resin mold may be replaced with the semiconductor module 160 shown in FIGS. 45, and 46.

According to the embodiments described above, the following effects can be obtained.

The semiconductor modules 10 to 13, 20 to 23, 30 to 33, 40, 50, 160 includes: a plurality of semiconductor elements (for example, the first semiconductor element 133 and the second semiconductor element 143); a resin mold (for example, a resin mold 120) that integrally sealing the plurality of semiconductor elements; and a plurality of conductive members (for example, 101 to 104, 111 to 116) electrically connected to at least one of the plurality of semiconductor elements.

In each of the above semiconductor modules, the plurality of semiconductor elements include a gate electrode 75, a first electrode (i.e., a source electrode 71), and a second electrode (i.e., a drain electrode 72), and are insulated gate type semiconductor elements in which a carrier moves from the first electrode side of the semiconductor element to the second electrode side through a carrier which is formed by applying a voltage to the gate electrode 75.

Further, in each of the above-mentioned semiconductor modules, a plurality of conductive members are exposed from the resin mold on the upper surface side or the lower surface side of the semiconductor module, and include the common wiring electrode (for example, 111, 113, 115) that is electrically connected to at least one of the first electrode and the second electrode and a non-common wiring electrode (for example, 101 to 104, 112, 114, 116). The non-common wiring electrode is an electrode exposed from the resin mold and electrically connected to an electrode of a semiconductor element different from the common wiring electrode. In other words, the non-common wiring electrode is an electrode exposed from the resin mold and connected to any of a plurality of semiconductor elements included in the semiconductor module, and has a connection destination different from the electrode of the semiconductor element to which the common wiring electrode is connected. Further, the wiring width of the common electrode connected to the common wiring electrode is wider than the wiring width of the non-common wiring electrode. Then, when the common wiring is connected to the common wiring electrode, the plurality of semiconductor elements and the plurality of conductive members are arranged so as to arrange the common wiring from one opposite side to the other side on the surface of the resin mold, on which the common wiring electrode is exposed, without being electrically connected to the non-common wiring electrode.

According to semiconductor modules 10 to 13, 20 to 23, 30 to 33, 40, 50, 160, for example, by arranging a plurality of semiconductor modules adjacent to each other and connecting the common wiring electrodes to each other by the common wiring, a plurality of semiconductor modules can be electrically connected to each other in the up-down direction of the semiconductor module. As a result, the wiring space on the side of the semiconductor module can be reduced, which can contribute to the downsizing of the mounting board. Further, in order to connect a plurality of semiconductor elements, it is possible to omit the wiring taken out to the side of the semiconductor element. As a result, the wiring area is reduced, the wiring resistance is reduced, and heat generation due to wiring can be suppressed.

The semiconductor modules 10 to 13, 20 to 23, 30 to 33, 40, 50, 160 include the common wiring region (for example, the common wiring regions A1c, A2c, A3c, A4c, A5c, A6a) which is a strip-shaped region extending substantially straight from one opposite side to the other on the surface of the resin mold on which the common wiring electrodes are exposed, and includes the common wiring region (for example, the common wiring regions A1c, A2c, A3c, A4c, A5c, A6a) in which the common wiring electrode exists and the non-common wiring electrode does not exist. Then, the common wiring is arranged in the common wiring region. While the common wiring electrode exists in the common wiring area, the non-common wiring electrode does not exist, so that the common wiring is arranged from one opposite side to the other on the surface of the resin mold where the common wiring electrode (for example, the conductive member 111) is exposed without electrically connecting to the non-common wiring electrode (for example, conductive members 101 to 104, 112).

A plurality of semiconductor elements, such as the semiconductor modules 10 to 13, 40, and 50, may be arranged substantially in parallel with the adjacent semiconductor elements in the same direction as the adjacent semiconductor elements. Further, a plurality of semiconductor elements such as the semiconductor modules 20 to 23, 30 to 33, 160 may be arranged substantially point-symmetrically with the adjacent semiconductor elements in the opposite direction to the adjacent semiconductor elements.

Like the semiconductor modules 30 to 33, the plurality of conductive members may include a connection conductive member (i.e., the conductive member 312) for connecting the first electrode (i.e., the source electrode) of the first semiconductor element 333 and the second electrode (i.e., the drain electrode) of the semiconductor element 343 disposed adjacent to the first semiconductor element 333 among the plurality of semiconductor elements.

At least one of the non-common wiring electrodes may have a high step portion (for example, a high step portion 112b) higher toward the surface side exposed from the resin mold and a low step portion (for example, a low step portion 112a) lower than the high step portion. By lowering the low step portion to such an extent that it is not electrically connected to the common wiring, it is possible to prevent the common wiring from being electrically connected to the non-common wiring electrode. Further, it may be preferable that the surface of the low step portion near the common wiring (for example, the surface of the low step portion 112a in the negative direction of the z-axis) is insulated. By insulating the surface of the low step portion near the common wiring, the distance between the common wiring and the low step portion can be narrowed as compared with the case where the low step portion is not insulated. Further, it may be more preferable to insulate the low step portion by covering it with an insulating resin mold. That is, it may be more preferable that the high step portion is exposed from the resin mold and the low step portion is not exposed from the resin mold.

Further, like the semiconductor modules 40 and 50, the common wiring electrode may extend to a position where it protrudes from both of the opposite pair of sides of the surface of the resin mold.

Further, each of the above semiconductor modules may be mounted on a wiring board (for example, a wiring board 650) with the surface on which the common wiring electrodes are exposed as a mounting surface. When the wiring board includes a wiring portion in which the semiconductor module is installed and a resist portion provided around the wiring portion, the resin mold may preferably have a higher thermal conductivity than the resist portion. The heat radiation of the wiring board and the semiconductor module can be promoted through the resin mold.

The surface facing the exposed surface of the common wiring electrode of the semiconductor module, such as the semiconductor modules 10, 20, 30, 40, 50, 160, may be covered with a resin mold. For example, as in the semiconductor module 160 illustrated and described, the module 1160 is arranged between the wiring board 650, on which the semiconductor module is mounted with the surface on which the common wiring electrodes are exposed as the mounting surface, and the housing 670, 671 disposed on the side facing the surface on which the common wiring electrodes are exposed, it can be suitably used. Specifically, by arranging the resin mold and the housing so as to be in contact with each other, the heat generated in the semiconductor module or the wiring board can be radiated to the housing side via the resin mold. Further, the resin mold may be configured to be in contact with the housing via a heat radiation member arranged between the resin mold and the housing. In this case, the thermal conductivity of the heat radiation member may be preferably equal to or higher than the thermal conductivity of the resin mold.

Each of the above semiconductor modules can be suitably used for mounting on the electric power steering system 80, and can contribute to minimizing the size and promoting heat radiation in the drive circuit and the like.

In the embodiments described above, a trench gate type MOSFET in which an n-channel is provided by application of a gate voltage is exemplified as a device structure of the semiconductor element, but the semiconductor element structure is not limited to the above example. For example, the semiconductor element structure may be a planar gate type, a p-channel type in which p-type and n-type are substituted in FIG. 6, an insulated gate bipolar transistor (IGBT) or a reverse conduction IGBT (RC-IGBT). When the semiconductor element is an IGBT, the emitter electrode corresponds to a first electrode, and the collector electrode corresponds to a second electrode. An external terminal electrically connected to the emitter electrode corresponds to a first terminal, and an external terminal electrically connected to the collector electrode corresponds to a second terminal.

In FIG. 8, the switches SU1*p* to SW2*n* and SP1, SC1, SP2, SC2 are not limited to the MOSFET of the first semiconductor element 133 and the second semiconductor element 143, and a voltage-controlled semiconductor switching element such as an IGBT may be used. When an IGBT including no freewheeling diode is used as each of the switches SU1*p* to SW2*n*, it is preferable to install a freewheeling diode for each of the switches SU1*p* to SW2*n*. Specifically, for example, a freewheeling diode may be connected in anti-parallel to each of the switches SU1*p* to SW2*n*, or a reverse conduction IGBT (RC-IGBT) in which the freewheeling diode is formed in the same semiconductor substrate as the semiconductor substrate of IGBT or the like may be used as each of the switches SU1*p* to SW2*n*.

The shapes of the multiple semiconductor elements, the resin mold, the first joint member, and the like are not limited to the case in which the shape is substantially rectangular when viewed from the top. The number of external terminals is not limited to the number described in each of the embodiments described above. For example, multiple gate terminals may be provided for each of the semiconductor elements. The drain terminal and the source terminal may have one or two terminals, or may have four or more terminals.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

What is claimed is:

1. A semiconductor module comprising:
   a plurality of semiconductor elements;
   a resin mold that integrally seals the plurality of semiconductor elements; and
   a plurality of conductive members that are electrically connected to at least one of the plurality of semiconductor elements, wherein:
   each semiconductor element is an insulated gate type semiconductor element, having a gate electrode, a first electrode, and a second electrode, in which a carrier moves from a side of the first electrode to a side of the second electrode in the semiconductor element through a channel provided by an application of a voltage to the gate electrode;
   the plurality of conductive members includes: a common wiring electrode that is exposed from the resin mold on an upper surface side or a lower surface side of the semiconductor module, and is electrically connected to at least one of the first electrode and the second electrode; and a non-common wiring electrode that is exposed from the resin mold and is electrically connected to an electrode of the semiconductor element different from the common wiring electrode;
   a wiring width of a common wiring connected to the common wiring electrode is wider than a wiring width of the non-common wiring electrode;
   when the common wiring is connected to the common wiring electrode, the plurality of semiconductor elements and the plurality of conductive members are disposed so as to arrange the common wiring from one side to an opposite side on a surface of the resin mold, on which the common wiring electrode is exposed, without being electrically connected to the non-common wiring electrode;
   the non-common wiring electrode includes: a high step portion disposed on the surface of the resin mold on which the non-common wiring electrode is exposed; and a low step portion lower than the high step portion;
   the high step portion is exposed from the resin mold; and
   the low step portion is not exposed from the resin mold,
   the semiconductor module further comprising:
   a common wiring region, having a stripe shape extending substantially straight from the one side to the opposite side on the surface of the resin mold on which the common wiring electrode is exposed, in which the common wiring electrode is disposed and the non-common wiring electrode is not disposed, wherein:
the common wiring region includes at least a part of the low step portion.

2. The semiconductor module according to claim 1, wherein:
the common wiring is arranged in the common wiring region.

3. The semiconductor module according to claim 1, wherein:
the plurality of semiconductor elements are arranged in a same direction as an adjacent semiconductor element and substantially parallel to the adjacent semiconductor element.

4. The semiconductor module according to claim 1, wherein:
the plurality of semiconductor elements are arranged in a direction opposite to an adjacent semiconductor element and substantially point-symmetrically with the adjacent semiconductor element.

5. The semiconductor module according to claim 1, wherein:
the plurality of conductive members include a connection conductive member that connects the first electrode of a first semiconductor element among the plurality of semiconductor elements and the second electrode of a second semiconductor element among the plurality of semiconductor elements arranged adjacent to the first semiconductor element.

6. The semiconductor module according to claim 1, wherein:
the common wiring electrode extends to a position protruding from both of an opposing pair of sides of the surface of the resin mold.

7. The semiconductor module according to claim 1, wherein:
the semiconductor module is mounted on a wiring board with a surface on which the common wiring electrode is exposed as a mounting surface;
the wiring board includes a wiring portion in which the semiconductor module is arranged and a resist portion disposed around the wiring portion; and
the resin mold has a higher thermal conductivity than the resist portion.

8. The semiconductor module according to claim 1, wherein:
an other surface of the semiconductor module, opposing the surface on which the common wiring electrode is exposed, is covered with the resin mold.

9. The semiconductor module according to claim 8, wherein:
the semiconductor module is disposed between a wiring board, on which the semiconductor module is mounted with a surface on which the common wiring electrode is exposed as a mounting surface, and a housing disposed on a side opposing the surface on which the common wiring electrode is exposed; and
heat generated in the semiconductor module or the wiring board is radiated to the housing via the resin mold.

10. The semiconductor module according to claim 9, wherein:
the resin mold is in contact with the housing via a heat radiation member arranged between the resin mold and the housing; and
the heat radiation member has a thermal conductivity equal to or higher than a thermal conductivity of the resin mold.

11. The semiconductor module according to claim 1, wherein:
the semiconductor module is mounted on an electric power steering system.

12. The semiconductor module according to claim 1, wherein:
the low step portion of the non-common wiring electrode is covered with the resin mold.

* * * * *